(12) United States Patent
Skaug et al.

(10) Patent No.: US 10,972,077 B2
(45) Date of Patent: Apr. 6, 2021

(54) SYSTEM AND METHOD OF DUPLICATE CIRCUIT BLOCK SWAPPING FOR NOISE REDUCTION

(71) Applicant: Silicon Laboratories Inc., Austin, TX (US)

(72) Inventors: Steffen Skaug, Oslo (NO); Vitor Pereira, Austin, TX (US); Arup Mukherji, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/912,652

(22) Filed: Jun. 25, 2020

(65) Prior Publication Data
US 2020/0328731 A1 Oct. 15, 2020

Related U.S. Application Data

(63) Continuation-in-part of application No. 16/219,173, filed on Dec. 13, 2018.

(51) Int. Cl.
*G01R 29/26* (2006.01)
*G06F 1/04* (2006.01)
*H03B 5/20* (2006.01)
*H03K 3/013* (2006.01)

(52) U.S. Cl.
CPC .................. *H03K 3/013* (2013.01)

(58) Field of Classification Search
CPC .. G01R 29/26; G06F 1/04; H03B 5/20; H03K 3/013
See application file for complete search history.

(56) References Cited

U.S. PATENT DOCUMENTS

| 4,771,420 A * | 9/1988 | Deschaine | ............ | H04M 3/561 370/376 |
| 9,823,687 B2 | 11/2017 | Mukherji et al. | | |
| 2003/0214868 A1* | 11/2003 | Baker | ................. | G11C 11/1693 365/207 |

OTHER PUBLICATIONS

Hsieh, Kuo-Chiang et al. "A Low-Noise Chopper-Stabilized Differential Switched-Capacitor Filtering Technique." *IEEE Journal of Solid-State Circuits*. vol. SC-16., No. 6, Dec. 1981. pp. 708-715.

(Continued)

*Primary Examiner* — Neel D Shah
(74) *Attorney, Agent, or Firm* — Gary Stanford

(57) ABSTRACT

An integrated circuit including a functional circuit including at least one swapping circuit node, multiple duplicate electronic circuits, and a switch circuit. The duplicate electronic circuits are integrated in close proximity with each other each including at least one electronic device that is susceptible to RTN. The switch circuit electrically couples a different selected subset of at least one of the duplicate electronic circuits to the at least one swapping circuit node for each of successive switching states during operation of the functional circuit. A method of reducing noise including selecting a subset of the duplicate electronic circuits, electrically coupling the selected duplicate electronic devices to at least one swapping circuit node of a functional circuit, and repeating the selecting and electrically coupling in successive switching states during operation of the functional circuit for different subsets of the duplicate electronic circuits.

20 Claims, 11 Drawing Sheets

(56) References Cited

OTHER PUBLICATIONS

Nys, Olivier et al. "A 19-Bit Low-Power Multibit Sigma-Delta ADS Based on Data Weighted Averaging." *IEEE Journal of Solid-State Circuits.* vol. 32, No. 7, Jul. 1997. pp. 933-942.

\* cited by examiner

| | P0 | P1 | P2 | P3 | P4 | P5 | P6 | P7 | P8 | ... | PQ |
|---|---|---|---|---|---|---|---|---|---|---|---|
| STATE N | ----- | ----- | MMP1 | MMP2 | MMP2 | MMP2 | MMP2 | ----- | ----- | ... | ----- |
| STATE N+1 | ----- | ----- | ----- | MMP1 | MMP2 | MMP2 | MMP2 | MMP2 | ----- | ... | ----- |
| STATE N+2 | ----- | ----- | ----- | ----- | MMP1 | MMP2 | MMP2 | MMP2 | MMP2 | ... | ----- |
| : | : | : | : | : | : | : | : | : | : | ... | : |

| | N0 | N1 | N2 | N3 | N4 | ... | NR |
|---|---|---|---|---|---|---|---|
| STATE N | ----- | ----- | MMN1 | ----- | ----- | ... | ----- |
| STATE N+1 | ----- | ----- | ----- | MMN1 | ----- | ... | ----- |
| STATE N+2 | ----- | ----- | ----- | ----- | MMN1 | ... | ----- |
| . | . | . | . | . | . | ... | . |
| . | . | . | . | . | . | . | . |

|          | NN0  | NN1  | NN2  | NN3  | NN4   | NN5   | NN6   | NN7   | NN8   | ... | NNU |
|----------|------|------|------|------|-------|-------|-------|-------|-------|-----|-----|
| STATE N  | ---- | ---- | MMNA | MMNA | MMNB1 | MMNB2 | MMNB3 | ----  | ----  | ... | --- |
| STATE N+1 | ---- | ---- | ---- | MMNA | MMNA  | MMNB1 | MMNB2 | MMNB3 | ----  | ... | --- |
| STATE N+2 | ---- | ---- | ---- | ---- | MMNA  | MMNA  | MMNB1 | MMNB2 | MMNB3 | ... | --- |
| ⋮        | ⋮    | ⋮    | ⋮    | ⋮    | ⋮     | ⋮     | ⋮     | ⋮     | ⋮     | ... | ⋮   |

*FIG. 18*

|          | PP0  | PP1  | PP2  | PP3  | PP4  | PP5  | PP6  | PP7  | PP8  | ... | PPV |
|----------|------|------|------|------|------|------|------|------|------|-----|-----|
| STATE N  | ---- | ---- | MMPC | MMPB | MMPA | MMPC | ---- | ---- | ---- | ... | --- |
| STATE N+1 | ---- | ---- | ---- | MMPC | MMPB | MMPA | MMPC | ---- | ---- | ... | --- |
| STATE N+2 | ---- | ---- | ---- | ---- | MMPC | MMPB | MMPA | MMPC | ---- | ... | --- |
| ⋮        | ⋮    | ⋮    | ⋮    | ⋮    | ⋮    | ⋮    | ⋮    | ⋮    | ⋮    | ... | ⋮   |

*FIG. 19*

|           | NNN0 | NNN1 | NNN2 | NNN3 |
|-----------|------|------|------|------|
| STATE N   | MCAP | ---- | ---- | ---- |
| STATE N+1 | ---- | MCAP | ---- | ---- |
| STATE N+2 | ---- | ---- | MCAP | ---- |
| STATE N+3 | ---- | ---- | ---- | MCAP |
| STATE N+4 | MCAP | ---- | ---- | ---- |
| ⋮         | ⋮    | ⋮    | ⋮    | ⋮    |

*FIG. 20*

SYSTEM AND METHOD OF DUPLICATE CIRCUIT BLOCK SWAPPING FOR NOISE REDUCTION

CROSS REFERENCE TO RELATED APPLICATION(S)

This application is a Continuation-in-Part of U.S. patent application Ser. No. 16/219,173, filed on Dec. 13, 2018, entitled "System And Method Of Duplicate Circuit Block Swapping For Noise Reduction," which is hereby incorporated by reference in its entirety for all intents and purposes.

BACKGROUND OF THE INVENTION

Field of the Invention

The present invention relates in general to electronic circuit noise reduction, and more particularly to a system and method of sequentially replacing or swapping duplicate circuit blocks to reduce Random Telegraph Noise (RTN) or "popcorn" noise in an electronic circuit.

Description of the Related Art

Random Telegraph Noise (RTN) or "popcorn" noise is characterized by sudden voltage or current transitions between two or more discrete levels in semiconductor devices. The characteristics of RTN present a challenge for circuits and applications that operate with relatively long time constants and that require relatively high accuracy. Clock circuits used for keeping time, for example, may suffer from RTN causing improper operation or erroneous results. Audio circuits may also suffer from RTN causing spurious or unwanted audible noise. Semiconductor parts that operate with a relatively large time constant and that fail specifications due to RTN are very difficult to screen at production test since the testing time necessary to detect failure is prohibitively long. Thus, it is not cost effective to screen parts during production test.

SUMMARY OF THE INVENTION

An integrated circuit according to one embodiment includes a functional circuit including at least one swapping circuit node, multiple duplicate electronic circuits, and a switch circuit. The duplicate electronic circuits are integrated in close proximity with each other, in which each includes at least one electronic device that is susceptible to random telegraph noise (RTN). The switch circuit electrically couples a different selected subset of at least one of the duplicate electronic circuits to the at least one swapping circuit node for each of successive switching states during operation of the functional circuit.

The duplicate electronic circuits may include multiple terminals including at least one terminal that remains coupled to a corresponding at least one circuit node of the functional circuit during the successive switching states. The switch circuit may electrically couple a remaining one or more of the terminals of the selected subset of the duplicate circuits to corresponding one or more swapping circuit nodes of the functional circuit for each of the successive switching states.

The functional circuit may include at least one first swapping circuit node and at least one second swapping circuit node. In this case the switch circuit may electrically couple a first subset of the duplicate electronic circuits to the at least one first swapping circuit node and electrically couple a second subset of the duplicate electronic circuits to the at least one second swapping circuit node for each of the successive switching states. The first and second subsets may include different numbers of the duplicate electronic circuits. The switch circuit may perform chopping during sequential switching states.

The functional circuit may include multiple first swapping circuit nodes and multiple second swapping circuit nodes. In this case the switch circuit may electrically couple terminals of each of a first subset of the duplicate electronic circuits to the first swapping circuit nodes and electrically couple terminals of each of a second subset of the duplicate electronic circuits to the second swapping circuit nodes for each of the successive switching states.

At least one of the duplicate electronic circuits may be selected in at least two successive switching states. The switch circuit may pseudo-randomly select from among the duplicate electronic circuits for each selected subset in each switching state. A duration of each of the successive switching states may be pseudo-randomly selected. At least one terminal of each unselected ones of the duplicate electronic circuits may be coupled to a bias node.

A method of reducing noise on a semiconductor circuit according to one embodiment includes selecting a subset from among duplicate electronic circuits that are susceptible to random telegraph noise (RTN) and that are integrated on the semiconductor circuit in close proximity with each other, electrically coupling the selected duplicate electronic devices to at least one swapping circuit node of a functional circuit, and repeating the selecting and electrically coupling in successive switching states during operation of the functional circuit for different subsets of the duplicate electronic circuits.

The method may include electrically coupling a subset of terminals of the selected duplicate electronic devices that are not already coupled to the function circuit. The method may include electrically coupling a first subset of the duplicate electronic circuits to at least one first swapping circuit node of the functional circuit and electrically coupling a second subset of the duplicate electronic circuits to at least one second swapping circuit node of the functional circuit. The method may include electrically coupling a first number of the duplicate electronic circuits to at least one first swapping circuit node of the functional circuit and electrically coupling a second and different number of the duplicate electronic circuits to at least one second swapping circuit node of the functional circuit.

The method may include chopping by electrically coupling a first duplicate electronic circuit to the at least one first swapping circuit node in a first switching state and to at least one second swapping circuit node in a second, sequential switching state, and by coupling a second duplicate electronic circuit to the at least one second swapping circuit node in the first switching state and to the at least one first swapping circuit node in the second switching state.

The method may include electrically coupling terminals of each of a first subset of the duplicate electronic circuits to first swapping circuit nodes and electrically coupling terminals of each of a second subset of the duplicate electronic circuits to second swapping circuit nodes. The method may include pseudo-randomly selecting from among the duplicate electronic circuits for each switching state. The method may include pseudo-randomly selecting a duration of each of the successive switching states. The method may include electrically coupling at least one terminal of each of unselected ones of the duplicate electronic circuits to a bias node.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 18 is a table illustrating swapping and chopping duplicate NMOS transistors of the second oscillator circuit in sequential states and round-robin fashion according to one embodiment of the present disclosure.

FIG. 19 is a table illustrating swapping and chopping duplicate PMOS transistors of the second oscillator circuit in sequential states and round-robin fashion according to one embodiment of the present disclosure.

FIG. 20 is a table illustrating swapping duplicate NMOS transistors for implementing one NMOS transistor of the second oscillator circuit in sequential states and round-robin fashion according to one embodiment of the present disclosure.

DETAILED DESCRIPTION

The inventors have recognized the problems associated with RTN and also the difficulty in detecting RTN during production testing. They have therefore developed a system and method of duplicate circuit block swapping to reduce RTN. RTN is reduced without the need to identify the source of RTN causing the performance degradation. Although large functional circuits may be duplicated and swapped out during operation to reduce noise and improve operation, judicious selection of the duplicated circuit block may reduce the area and power penalty associated therewith.

Figure 1:
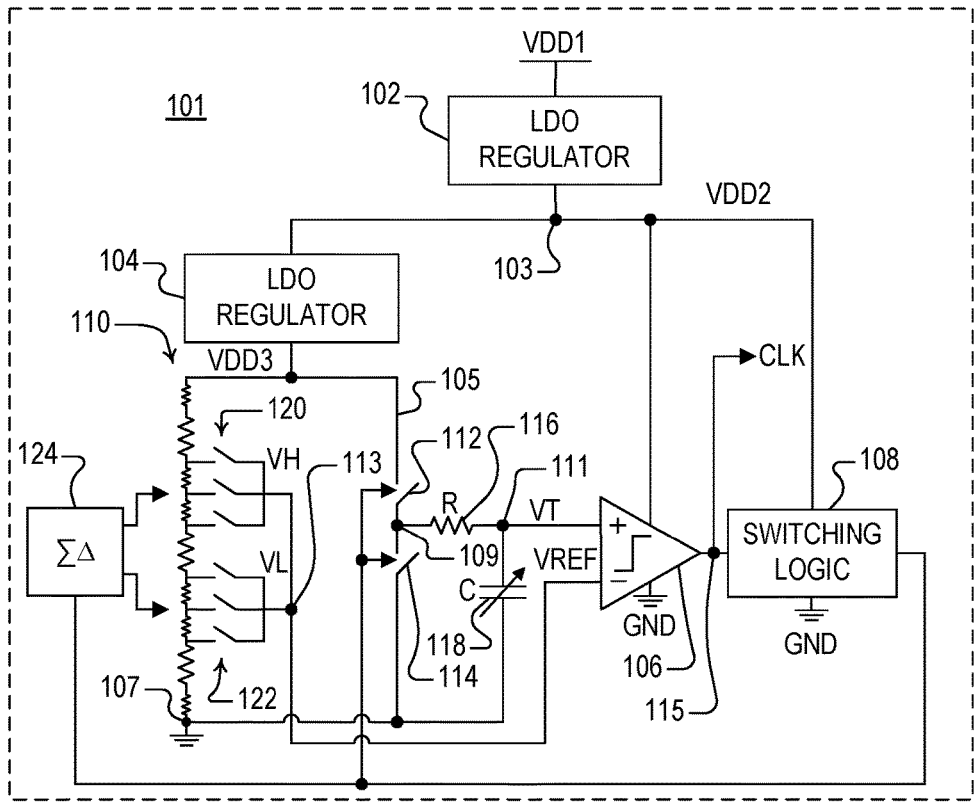
FIG. 1 is a schematic and block diagram of a conventional relaxation oscillator.

FIG. 1 is a schematic and block diagram of a conventional relaxation oscillator 101, such as described in U.S. Pat. No. 9,823,687, entitled "LOW FREQUENCY PRECISION OSCILLATOR," issued Nov. 13, 2017 to Mukherji et al. A first low dropout (LDO) regulator 102 receives a first supply voltage VDD1 and provides a second supply voltage VDD2 on a supply node 103, and a second LDO regulator 104 receives VDD2 and provides a third supply voltage VDD3 on a supply node 105. VDD2 is used to supply power to a comparator 106 and switching logic 108, both referenced to a reference supply voltage, such as ground (GND), which is developed on a reference supply node 107. A resistor divider 110 including a string or array (or even a matrix) of resistors is coupled between node 105 and GND. A first single-pole, single-throw (SPST) switch 112 has its switch terminals coupled between node 105 and another node 109, and a second SPST switch 114 has its switch terminals coupled between node 109 and GND. The SPST switches described herein may be implemented in any suitable manner, such as using transistors devices including MOS transistors or field-effect transistors or the like. A resistor 116 with resistance R is coupled between node 109 and a node 111 developing a voltage VT, and a capacitor 118 with capacitance C is coupled between node 111 and GND.

The oscillator 101 further includes the comparator 106 having a negative (or inverting) input coupled to a node 113 developing a reference voltage VREF, having a positive (or non-inverting) input coupled to node 111, and an output coupled to a node 115 developing a clock signal CLK. CLK is provided to an input of the switching logic 108, which has a set of control outputs controlling the switches 112 and 114 and a sigma-delta modulator 124. The sigma-delta modulator 124 controls a set of upper switches 120 to select a first intermediate node of the resistor divider 110 for developing an upper voltage VH and controls a set of lower switches 122 to select a second intermediate node of the resistor divider 110 for developing a lower voltage VL. The switching logic 108 selects one of VH or VL as the reference voltage VREF on node 113 provided to the comparator 106. The sigma-delta modulator 124 may adjust VH or VL over time to maintain a certain average frequency. Although not shown, the sigma-delta modulator 124 may input a digital word from a calibration circuit to calibrate the average frequency.

In general operation of the oscillator 101, the switching logic 108 opens the switch 114 and closes the switch 112 and selects the upper voltage VH as VREF. In this manner, the voltage VDD2 is applied across the series combination of the resistor 116 and the capacitor 118, which charges to increase the voltage VT. When VT reaches the voltage level of VREF, the comparator 106 toggles CLK high causing the switching logic 108 to close the switch 114 and open the switch 112 and to select the lower voltage VL as VREF. In this manner, the capacitor 118 is coupled in parallel with the resistor 116 so that it discharges to decrease the voltage VT. When VT falls to the voltage level of VREF, the comparator 106 toggles CLK low causing the switching logic 108 to re-open the switch 114 and close the switch 112 and to once again select the higher voltage VH as VREF. Operation repeats in this manner to develop the CLK signal having a frequency based on the voltage levels VDD3, VH, and VL, the resistance R and the capacitance C.

The waveform across the capacitor 118 approximates a triangular wave (of course with exponential rising/decaying shape) and the threshold settings at the comparator input are switched during consecutive cycles. The resistance R of the resistor 116 may be trimmed or the like and the capacitance C of the capacitor 118 may be calibrated or the like (shown as a variable capacitor). Additional supporting circuitry may be included to achieve temperature independence in order to maintain stable frequency across an expected operating temperature range. In one embodiment, the oscillator 101 is designed to achieve a very high frequency stability interval at constant temperature. It is noted, however, that a transistor within the comparator 106 may be affected by random telegraph noise (RTN) causing a fluctuation in current or voltage over time so that the frequency of CLK is inconsistent as further described herein.

Figure 2:
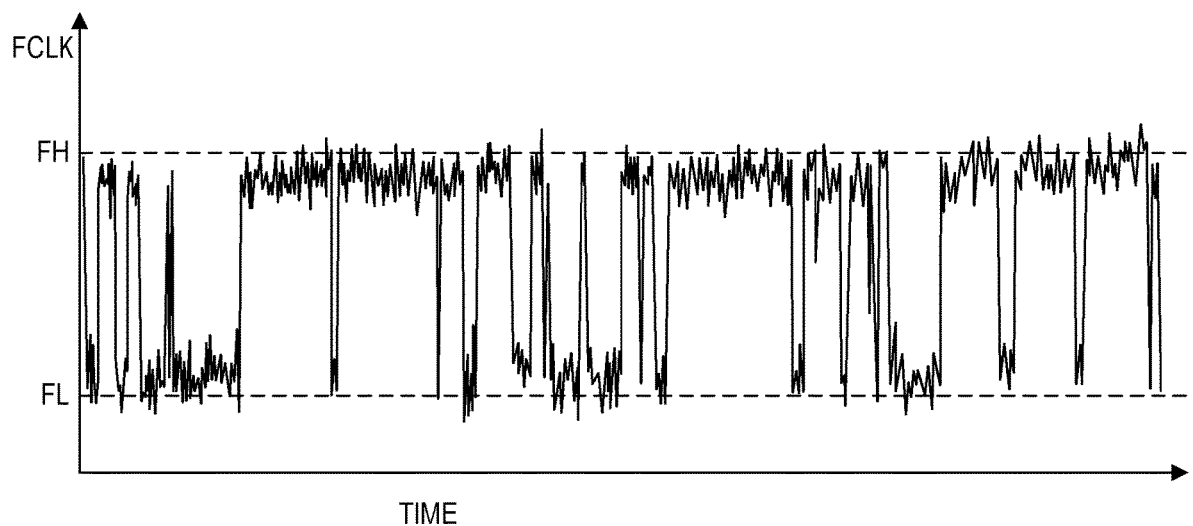
FIG. 2 is a timing diagram plotting a measurement of the average frequency of the CLK signal versus time when a transistor within the comparator of FIG. 1 is affected by RTN.

FIG. 2 is a timing diagram plotting a measurement of the average frequency of the CLK signal versus time when a transistor within the comparator 106 is affected by RTN. Although the frequency is intended to be very stable, instead the frequency jumps between two relatively discrete frequency levels FL and FH over time consistent with the well-known Lorentzian behavior because of RTN. Although the difference between FL and FH may be relatively small, this fluctuation in frequency may cause the oscillator 101 to fail a requisite frequency specification such as when used as an accurate timing reference. It may be possible to measure the actual frequency and detect the frequency error and possibly even the transistor affected with RST noise. However, when the time constant is on the order of milliseconds (ms) or even seconds, the test interval for detecting the frequency error may be prohibitively long for standard production test procedures. In other words, the practical production test time may not have sufficient duration to detect parts affected by RTN.

Figure 3:
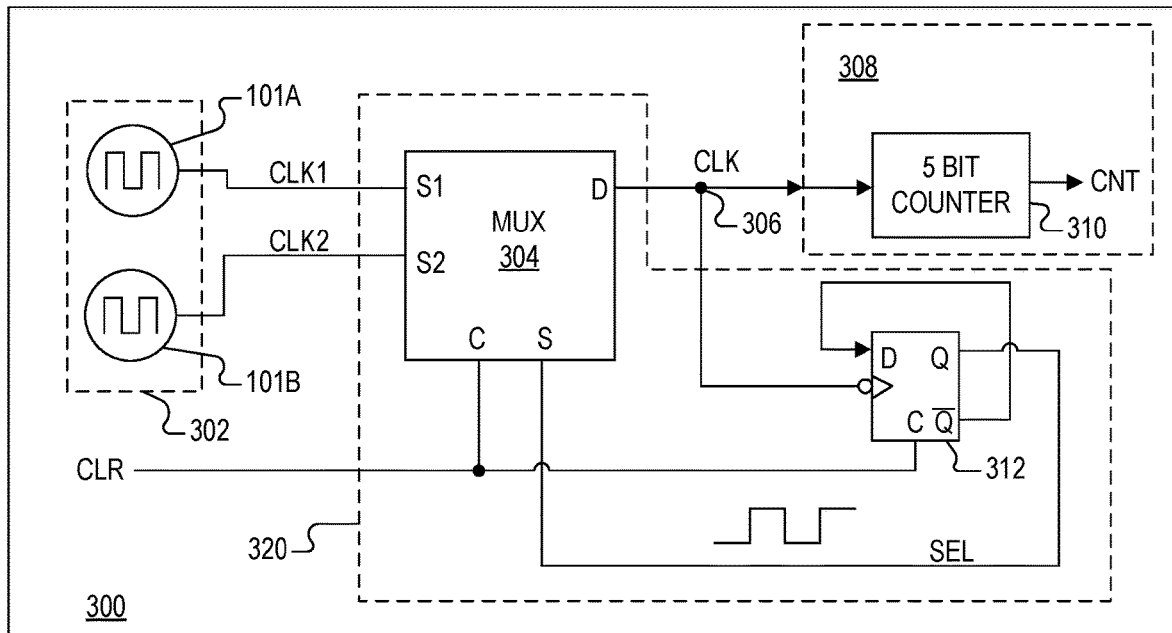
FIG. 3 is a simplified block diagram of an integrated circuit implemented with a system and method of duplicate circuit block swapping for noise reduction according to one embodiment in which an entire functional circuit is duplicated.

FIG. 3 is a simplified block diagram of a semiconductor chip or integrated circuit (IC) 300 implemented with a system and method of duplicate circuit block swapping for noise reduction according to one embodiment. Two duplicate oscillators 101A and 101B are integrated onto the IC 300 in close proximity with each other within a circuit area 302. The oscillators 101A and 101B are duplicates of each other and each may be configured according to the same or similar design as the oscillator 101. It has been observed during laboratory testing of duplicate circuit blocks integrated in close proximity with each other that there is a high probability that when one circuit block is affected with RTN, the remaining nearby circuit blocks are not affected with RTN. In other words, when there are a number N of duplicate blocks integrated onto a IC in close proximity to each other, in which N is any suitable integer number greater than one (e.g., 2, 3, 4, 8, 16, etc.), if one of the circuit blocks is affected with RTN, then chances are that the remaining circuit blocks are not. For purposes of illustration, it is assumed that oscillator 101A is affected with RTN whereas the oscillator 101B is not.

The oscillator 101A generates a first clock signal CLK1 and the oscillator 101B generates a second clock signal CLK2. CLK1 and CLK2 are provided to respective select terminals S1 and S2 of an analog multiplexer (MUX) 304. The MUX 304 has a D terminal coupled to a clock node 306 which is further coupled to remaining circuitry 308 integrated on the IC 300. The clock node 306 may more generally be referred to as a timing node. The MUX 304 operates to electrically couple one of the select terminals S1 and S2 to the D terminal depending upon it's select input S. In the illustrated embodiment, the remaining circuitry 308 includes a 5-bit counter 310, in which CLK is provided to an input of the counter 310 and to the inverted clock input of a D-type flip-flop (DFF) 312. The MUX 304 provides a selected one of the clock signals CLK1 and CLK2 as the clock signal CLK to the DFF 312 and to the remaining circuitry 308 including the counter 310, and the counter 310 outputs a 5-bit count value CNT indicating the number of rising edges of CLK. The inverted output $\overline{Q}$ of the DFF 312 is fed back to its data input D, and the non-inverted output Q of the DFF 312 generates a select signal SEL which is provided to the select input S of the MUX 304 for coupling one of the terminals S1 or S2 to the D terminal. A clear signal CLR may be provided to clear inputs of the MUX 304 and the DFF 312. The MUX 304 and the DFF 312 collectively form a switch circuit 320 (also integrated on the IC 300) for swapping between the clock signals CLK1 and CLK2 for developing the clock signal CLK.

The remaining circuitry 308 of the IC 300 coupled to the clock node 306 for receiving the CLK signal may be as simple or as comprehensive as desired depending upon the overall functionality of the IC 300. For example, the remaining circuitry 308 may simply include the counter 310 along with any other supporting circuitry not shown or described. Alternatively, the remaining circuitry 308 may be significantly more complex, such as including processing circuitry, memory, input/output (I/O) circuitry, etc.

Figure 4:
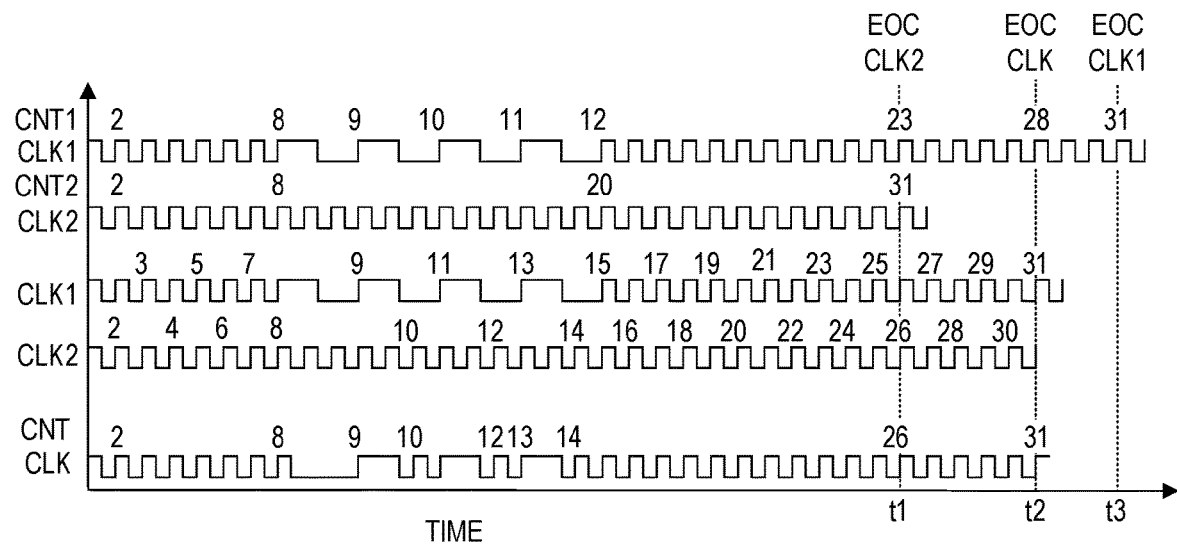
FIG. 4 is a timing diagram illustrating operation of the switch circuit of FIG. 3 that swaps between the clock signals CLK1 and CLK2 of the oscillators of FIG. 3, respectively, for developing a clock signal CLK with reduced noise.

FIG. 4 is a timing diagram illustrating operation of the switch circuit 320 that swaps between the clock signals CLK1 and CLK2 of the oscillators 101A and 101B, respectively, for developing the clock signal CLK with reduced noise. The timing diagram plots the clock signal CLK1 and CLK2 and corresponding count values CNT1 and CNT2 indicating the respective number of rising clock edges that would be counted by the counter 310 if counted independently. The timing diagram further repeats the CLK1 and CLK2 plots with alternating count values to show that edges of CLK1 are selected as odd counts and edges of CLK2 are selected as even counts because of operation of the switch circuit 320. The resulting clock signal output CLK is plotted along with its corresponding count by the counter 310.

The first 8 cycles of CNT1 and CNT2 track each other since they are duplicate circuits. It is assumed for purposes of illustration that the oscillators 101A and 101B are initially synchronized with each other, although additional circuitry (not shown) may be included for this purpose. The oscillator 101B is not affected by RTN so that its frequency does not change, so that if independently counted by the counter 310, it reaches an end of count (EOC) of 31 cycles at a first time t1. The oscillator 101A, however, is affected by RTN so that its frequency changes during the count process. Thus, when independently the clock cycles generated by the oscillator 101A are counted by the counter 310, the count value reaches 31 at a later time t3 which is significantly delayed as compared to time t1. As shown, cycles 8-11 of CLK1 are longer in duration because of RTN. The difference in EOC duration is substantially magnified to more clearly illustrate the frequency change. In an actual configuration, the frequency difference is relatively small and may be imperceptible to the naked eye. When the number of cycles is multiplied by a large amount, however, the difference between the duration to EOC becomes significant.

The switch circuit 320 operates by switching between the clock signals CLK1 and CLK2 of the oscillators 101A and 101B with each falling edge of CLK, so that the counter 310 counts only selected edges of the clock signals CLK1 and CLK2. The result is that the final EOC value of 31 for the clock signal CLK is reached more quickly at an intermediate time t2. Although time t2 is after time t1 so that an error still occurs, time t2 is before time t3 illustrating that the error has been reduced. The resulting output clock signal CLK and its corresponding count by the counter 310 is plotted last showing the final result.

It is noted that if neither of the oscillators 101A and 101B are affected by RTN, then the resulting error is negligible. Also, if both of the oscillators 101A and 101B are affected by RTN, then the resulting error still decreases because of the random nature of RTN. Based on actual laboratory measurements, however, it has been determined that there is a very high probability only one of multiple duplicate circuit blocks are affected by RTN when integrated in close proximity to each other even when N is relatively large, such as, for example, N=8. It has further been determined that for N duplicate circuit blocks in close proximity, if RTN follows statistics of a gaussian random process, then the error is expected to be reduced by an average factor of approximately $\sqrt{N}$, but that if RTN is not random but instead is deterministic, that the error may be reduced even further up to a factor of approximately N.

The implementation shown in FIG. 3 does not require any actual knowledge of the exact source of the RTN problem. Thus, there is no need to identify which particular transistor within the affected oscillator has RTN and thus causing the performance degradation. The implementation shown in FIG. 3, however, has several disadvantages when replicating the entire oscillator. For example, there is a 100% area and power penalty since the entire oscillator circuit block is replicated. In addition, additional implementation difficulties are encountered because in an actual configuration, the multiple oscillators are likely to be out of phase with each other so additional circuitry may be necessary.

Figure 5:
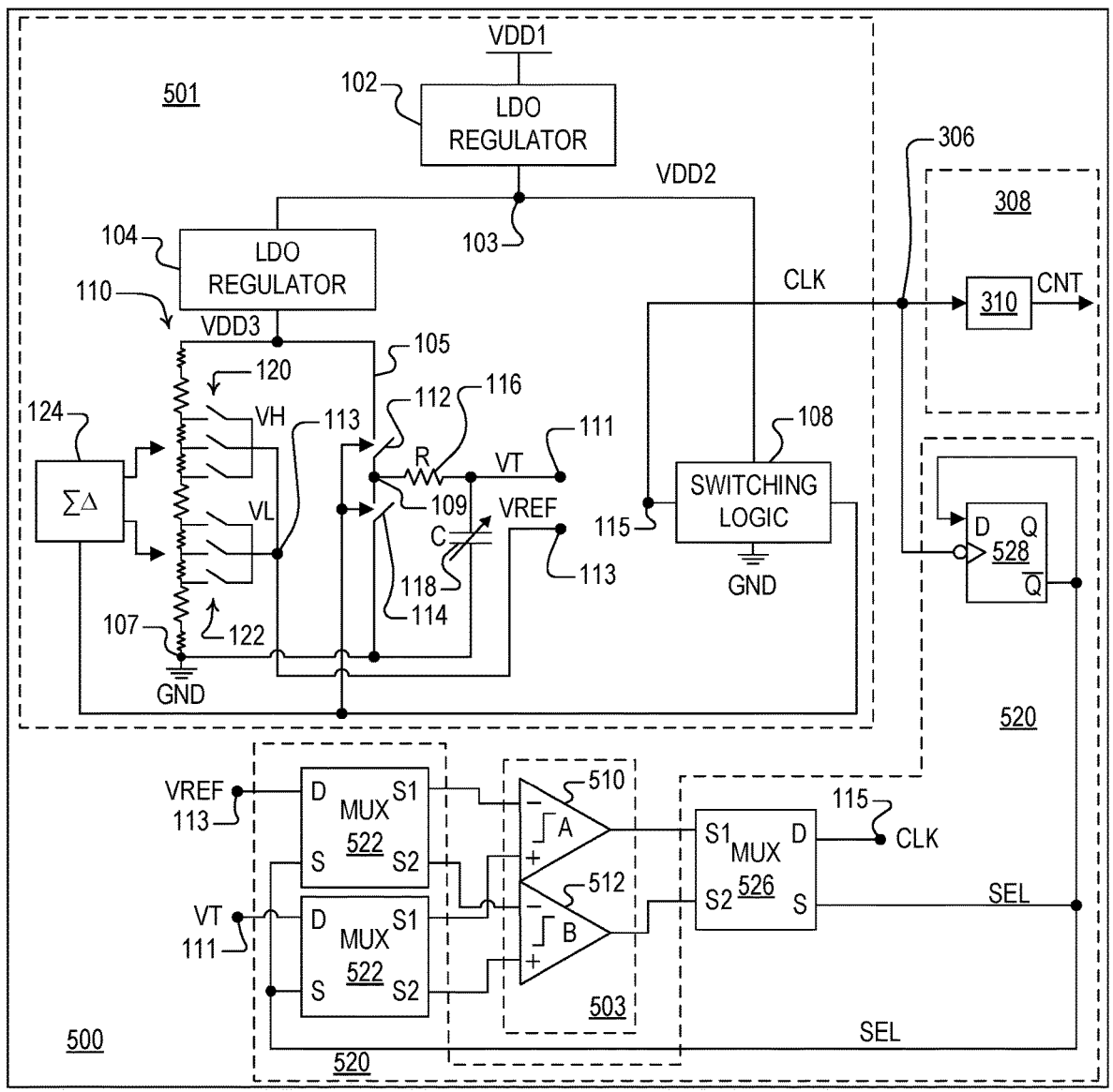
FIG. 5 is a simplified schematic and block diagram of another IC implemented with a system and method of duplicate circuit block swapping for noise reduction according to another embodiment in which a smaller portion of the functional circuit affected by RTN is duplicated and swapped.

FIG. 5 is a simplified schematic and block diagram of another IC 500 implemented with a system and method of duplicate circuit block swapping for noise reduction according to another embodiment. An oscillator 501 designed substantially the same as the oscillator 101 is integrated onto the IC 500, except that the comparator 106 shown in FIG. 1 is excluded. The remaining circuitry 308 with the counter 310 may be included to receive the clock signal CLK via the clock node 306 and to provide CNT. In a similar manner as described for the IC 300, the remaining circuitry 308 may be as simple or as complex as desired depending upon the overall functionality of the IC 500.

In this case, a pair of duplicate comparators 510 and 512 are integrated in close proximity to each other within a circuit area 503 of the IC 500. It is assumed for purposes of illustration that the comparator 510 (or comparator A) is affected by RTN and comparator 512 (or comparator B) is not. Node 113 (VREF) is coupled to the terminal D of a first analog MUX 522, node 111 (VT) is coupled to the D terminal of a second analog MUX 524, and node 115 (CLK) is coupled to the D terminal of a third analog MUX 526. Select terminal S1 of the first MUX 522 is coupled to the negative input of the first comparator 510, select terminal S2 of the first MUX 522 is coupled to the negative input of the second comparator 512, select terminal S2 of the second MUX 522 is coupled to the positive input of the first comparator 510, and select terminal S2 of the second MUX 524 is coupled to the positive input of the comparator 512. The output of the first comparator 510 is coupled to terminal S1 of the third MUX 526, and the output of the second comparator 512 is coupled to terminal S2 of the third MUX 526. The CLK signal is provided to the inverting clock input of a DFF 528, which has its inverting output $\overline{Q}$ providing a select signal which is fed back to its data input D and to the select inputs of the MUXes 522, 524, and 526. The analog MUXes 522, 524, and 526 operate in the same manner as described for the analog MUX 304.

The MUXes 522, 524, and 526 and the DFF 528 collectively form a switch circuit 520 for alternatively coupling one the comparators 510 and 512 (or comparators A and B, respectively) with each falling edge of CLK. When SEL is high, the comparator A is coupled into the oscillator 501 and comparator B is disconnected, and when SEL is low, comparator A is disconnected and comparator B is coupled into the oscillator 501. When a selected one of the comparators A and B is coupled into the oscillator 501, node 113 (VREF) is coupled to the negative input, node 111 (VT) is coupled to the positive input, and node 115 (CLK) is coupled to the output of the selected comparator. SEL is toggled to opposite states with each falling edge of CLK. In this manner, rather than duplicating and swapping the entire oscillator circuit block, only the comparator circuit block of the oscillator is duplicated and swapped in successive cycles of CLK.

Figure 6:
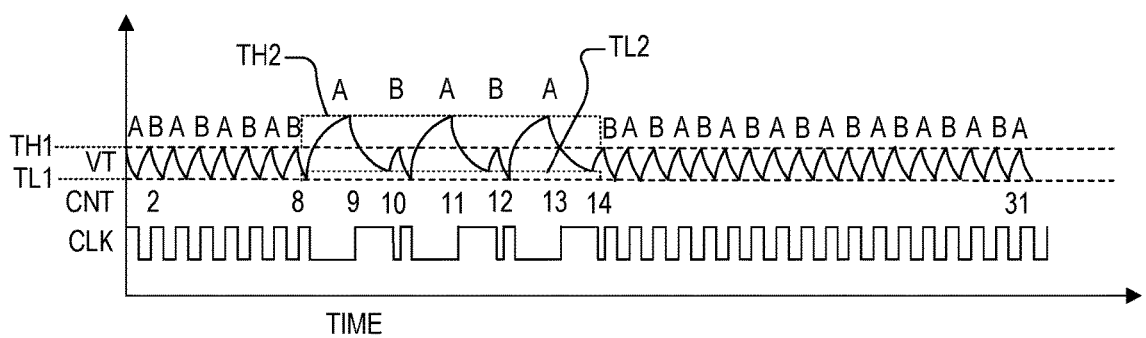
FIG. 6 is a timing diagram plotting signals of the IC of FIG. 5 versus time according to one embodiment.

FIG. 6 is a timing diagram plotting VT, CNT and CLK versus time according to one embodiment. When the RTN is not active, the VT signal charges and discharges between a first low threshold voltage TL1 and a first high threshold voltage TL2 for both comparators A and B when coupled. When RTN is active for the comparator A and comparator A is coupled to the oscillator 501, VT voltage charges and discharges between a second low threshold voltage TL2 and a second high threshold voltage TH2. The differences between the low thresholds TL1 and TL2 and between TH1 and TH2 are substantially magnified for purposes of illustration. The change in the low and high threshold voltages changes the timing of the VT voltage and thus modifies the frequency of CLK.

In the first 8 cycles of CLK, the comparators A and B are swapped with each other every negative edge of CLK for coupling to the oscillator 501. While the RTN is not active, VT charges and discharges between TL1 and TH1 so that operation of each of the comparators A and B is the same and the results are indistinguishable. In the falling edge of the $8^{th}$ cycle of CLK when comparator A is selected, however, RTN becomes active so that VT charges to TH2 and then discharges to TL2. When VT reaches TL2, the CLK signal goes low so that comparator B is selected to be coupled. Thus in the $10^{th}$ cycle, VT charges to TH1 and then discharges down to TL1. When VT reaches TL1, the CLK signal goes low so that comparator A is selected to be coupled for the $11^{th}$ cycle. Since the RTN is still active in comparator A, VT charges up to TH2 and then discharges down to TL2 in the $11^{th}$ cycle. Again, when VT reaches TL2, the CLK signal goes low so that the comparator B is selected to be coupled for the $12^{th}$ cycle in which VT charges to TH1 and discharges down to TL1. Operation repeats in this manner for the $13^{th}$ and $14^{th}$ cycles. When VT discharges down to TL1 at the end of the $14^{th}$ cycle, however, the RTN is no longer active so that when the comparator A is next selected for the $15^{th}$ cycle, VT charges to TH1 and back down to TL1 according to normal operation. Operation continues in this manner while the RTN is not active for the remaining cycles up to the $31^{st}$ cycle at the EOC.

As shown in FIG. 6, RTN does affect operation during a portion of the overall operation period. It is noted, however, that if the comparator A affected with RTN was used as the only comparator in the oscillator 501 instead of both oscillators A and B, then the level of error over an extended period of time becomes significantly larger just as is the case for the oscillator 101. The swapping of duplicate comparators A and B, however, substantially reduces the overall error for improved operation. The duplication and swapping of a comparator circuit block of a single oscillator provides several advantages over duplicating and swapping the entire oscillator circuit block. The area and power penalty is substantially reduced since large portions of the oscillator circuit, such as the LDO regulators 102 and 104, the sigma-delta modulator 124, the switching logic 108, etc., are not replicated. Also, the complications of phase error correction between multiple oscillators are avoided.

Figure 7:
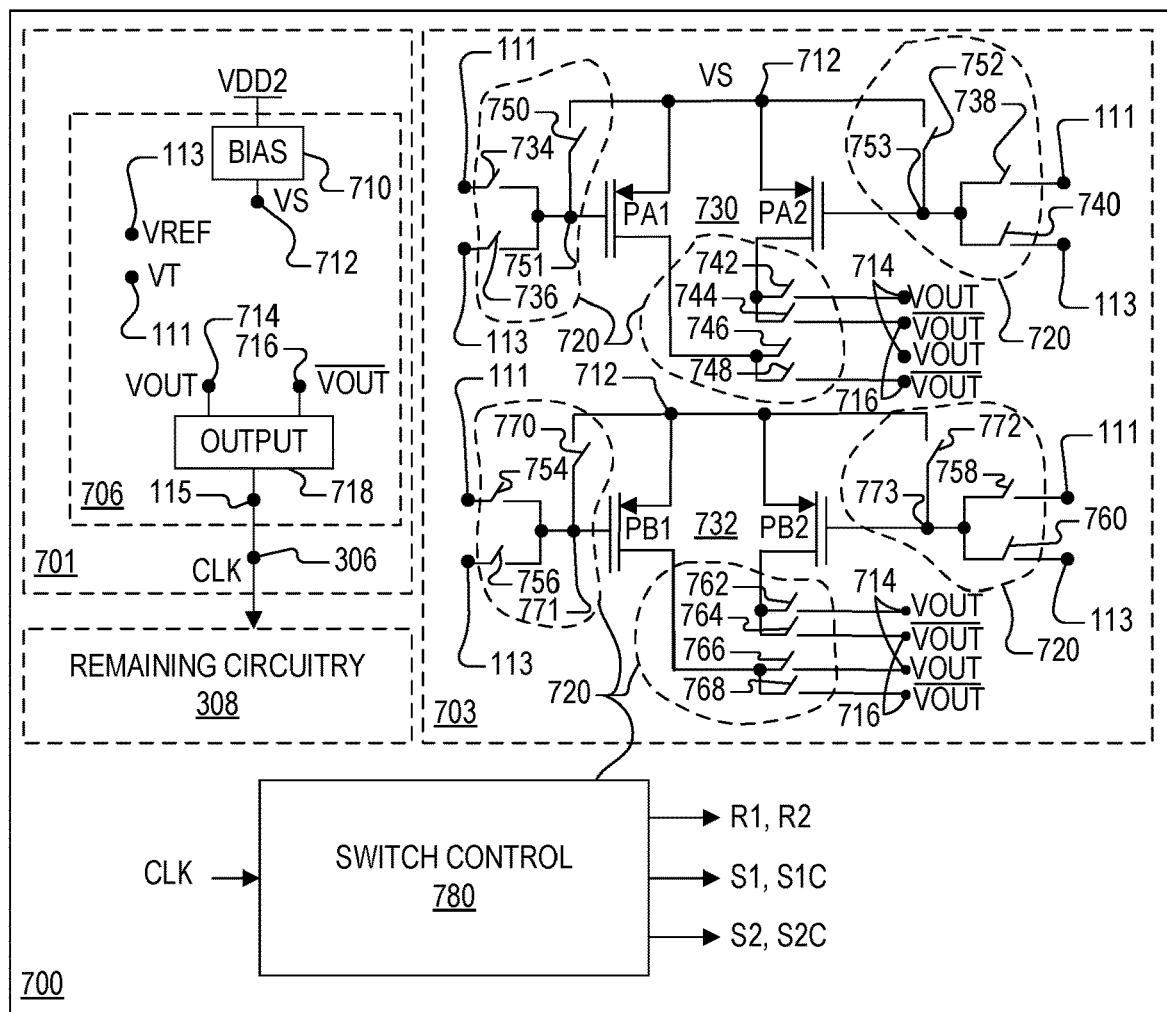
FIG. 7 is a simplified schematic and block diagram of yet another IC implemented with a system and method of duplicate circuit block swapping for noise reduction according to another embodiment in which an even smaller portion of the functional circuit affected by RTN is duplicated and swapped, such as, for example, a single transistor differential pair.

FIG. 7 is a simplified schematic and block diagram of yet another IC 700 implemented with a system and method of duplicate circuit block swapping for noise reduction according to another embodiment. An oscillator 701 designed substantially the same as the oscillator 101 is integrated onto the IC 700, and includes a portion of a comparator 706 that is substantially similar to the comparator 106 coupled to the nodes 111, 113 and 115. The comparator 706 includes a bias circuit 710 coupled between the supply voltage VDD2 and a source node 712. The comparator 706 further includes an output circuit 718 having a pair of inputs coupled to a pair of differential output nodes 714 and 716 developing internal differential output voltages VOUT and $\overline{\text{VOUT}}$, respectively. The output circuit 718 has an output providing the CLK signal to the node 115, which is further coupled to the clock node 306. The remaining circuitry 308 is included and coupled to node 306 for receiving the CLK signal in a similar manner previously described. It is noted that since the entire oscillator 501 is not being switched out but instead just the oscillator comparator, that output node 115 may be electrically connected directly to the clock node 306.

In this case, a pair of duplicate transistor differential pairs 730 and 732 are integrated in close proximity to each other within a circuit area 703 of the IC 700. The differential pair 730 includes P-type MOS (PMOS) transistors PA1 and PA2 and the differential pair 732 includes PMOS transistors PB1 and PB2. If either one of the differential pairs 730 and 732 is affected by RTN, then there is a high probability that the other is not. More specifically, if any one of the transistors PA1, PA2, PB1 and PB2 is affected by RTN, then there is a high probability that the other transistors are not. As further described herein, a switch circuit 720 including a set of SPST switches and a switch control circuit 780 to control the switches is provided on the IC 700 to selectively insert one of the differential pairs 730 and 732 into the comparator 701 in successive cycles of CLK. Also, since the differential pairs 730 and 732 are symmetrical, the switch control circuit 780 controls the switches to perform "chopping" between the transistors of each differential pair as further described herein.

For the differential pair 730, PA1 has its source terminal coupled to the source node 712 and its gate terminal coupled to a node 751, and PA2 has its source terminal coupled to the source node 712 and its gate terminal coupled to a node 753. Furthermore, a switch 734 has its switched terminals coupled between node 111 and node 751, a switch 736 has its switched terminals coupled between node 113 and node 751, a switch 738 has its switched terminals coupled between node 111 and node 753, a switch 740 has its switched terminals coupled between node 113 and node 753, a switch 742 has its switched terminals coupled between the drain terminal of PA2 and node 714, a switch 744 has its switched terminals coupled between the drain terminal of PA2 and node 716, a switch 746 has its switched terminals coupled between the drain terminal of PA1 and node 714, a switch 748 has its switched terminals coupled between the drain terminal of PA1 and node 716, a switch 750 has its switched terminals coupled between nodes 712 and 751, and a switch 752 has its switched terminals coupled between nodes 712 and 753. The switches 734, 740, 742, and 748 are controlled by a control signal S1, the switches 736, 738, 744, and 746 are controlled by a control signal S1C, and the switches 750 and 752 are controlled by a control signal R1. The switch control circuit 780 generates the control signals R1, S1 and S1C based on the CLK signal.

For the differential pair 732, PB1 has its source terminal coupled to the source node 712 and its gate terminal coupled to a node 771, and PB2 has its source terminal coupled to the source node 712 and its gate terminal coupled to a node 773. Furthermore, a switch 754 has its switched terminals coupled between node 111 and node 771, a switch 756 has its switched terminals coupled between node 113 and node 771, a switch 758 has its switched terminals coupled between node 111 and node 773, a switch 760 has its switched terminals coupled between node 113 and node 773, a switch 762 has its switched terminals coupled between the drain terminal of PB2 and node 714, a switch 764 has its switched terminals coupled between the drain terminal of PB2 and node 716, a switch 766 has its switched terminals coupled between the drain terminal of PB1 and node 714, a switch 768 has its switched terminals coupled between the drain terminal of PB1 and node 716, a switch 770 has its switched terminals coupled between nodes 712 and 771, and a switch 772 has its switched terminals coupled between nodes 712 and 773. The switches 754, 760, 762 and 768 are controlled by a control signal S2, the switches 756, 758, 764 and 766 are controlled by a control signal S2C, and the switches 770 and 772 are controlled by a control signal R2. The switch control circuit 780 also generates the control signals R2, S2 and S2C based on the CLK signal.

Figure 8:
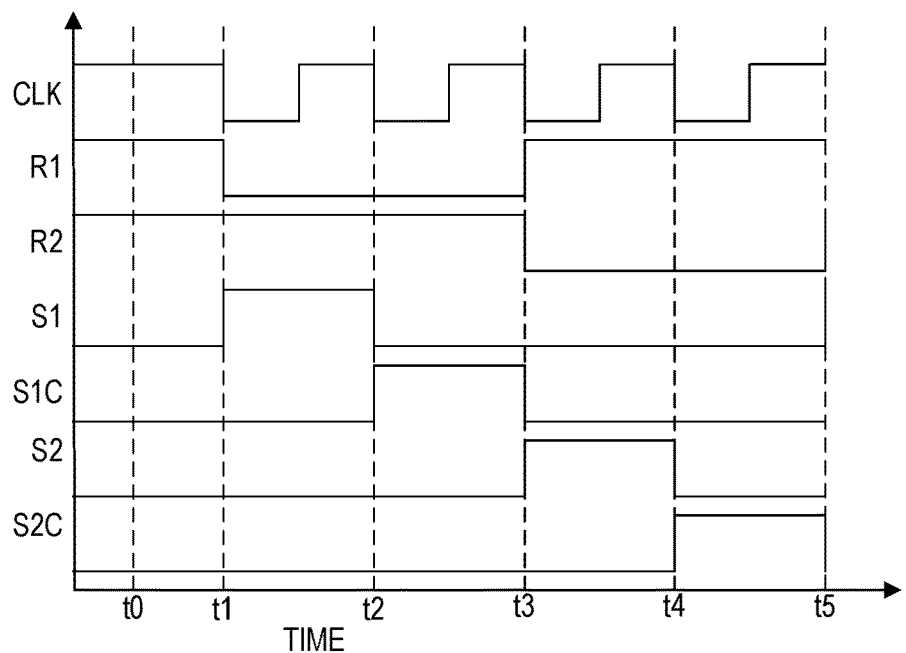
FIG. 8 is a timing diagram plotting the clock and the control signals versus time illustrating operation of the switch control circuit of FIG. 7 for controlling the switches of the corresponding switch circuit according to one embodiment.

FIG. 8 is a timing diagram plotting CLK and the control signals R1, R2, S1, S1C, S2 and S2C versus time illustrating operation of the switch control circuit 780 for controlling the switches of the switch circuit 720 according to one embodiment. At an initial or preliminary time t0, the system may be in reset in which both R1 and R2 are asserted high. When the control signal R1 is asserted high, the switches 750 and 752 are closed so that the gate and source terminals of the transistors PA1 and PA2 of the differential pair 730 are shorted together. Also, when the control signal R2 is asserted high, the switches 770 and 772 are closed so that the gate and source terminals of the transistors PB1 and PB2 of the differential pair 732 are shorted together. The control signals S1, S1C, S2 and S2C are low so that both of the differential pairs 730 and 732 are removed from the circuit so that the comparator 701 is inoperative during the reset state.

CLK and R1 both go low at a subsequent time t1 while S1 is asserted high. R1 pulls the differential pair 730 out of reset mode and S1 couples the differential pair 730 into the comparator 701. In particular, the switches 750 and 752 are opened and the switches 734, 740, 742, and 748 are closed so that the gate terminal of PA1 is coupled to node 111 for receiving VT, the drain terminal of PA1 is coupled to node 716 for developing the negative output signal $\overline{VOUT}$, the gate terminal of PA2 is coupled to node 113 for receiving VREF, and the drain terminal of PA2 is coupled to node 714 for developing the positive output signal VOUT. Also when CLK goes low, VREF is increased to VH and the switch 112 is closed so that the capacitor 118 charges to increase VT. When VT rises to VREF, CLK is asserted high, VREF is decreased to VL and the capacitor 118 discharges to decrease VT.

When VT falls to VREF at subsequent time t2, CLK and S1 are both asserted low while S1C is asserted high so that the differential pair 730 remains coupled but is chopped so that the transistors PA1 and PA2 are swapped. In particular, while the switches 750 and 752 remain open, the switches 736, 738, 744, and 746 are closed so that the gate terminal of PA1 is coupled to node 113 for receiving VREF, the drain terminal of PA1 is coupled to node 714 for developing the positive output signal VOUT, the gate terminal of PA2 is coupled to node 111 for receiving VT, and the drain terminal of PA2 is coupled to node 716 for developing the negative output signal $\overline{VOUT}$. In effect, the transistors PA1 and PA2 are swapped with each other for the next CLK cycle. The cycle is substantially repeated, in which VREF is increased to VH and the capacitor 118 charges to increase VT. When VT rises to VREF, CLK goes high, VREF is decreased to VL and the capacitor discharges to decrease VT.

When VT falls to VREF at subsequent time t3, R1 is asserted high to place the differential pair 730 in reset mode while R2 is asserted low to pull the differential pair 732 out of its reset mode. Also, S1C is pulled low to de-couple the differential pair 730 and S2 is asserted high to couple the differential pair 732 into the comparator 701. In particular, the switches 754, 760, 762, and 768 are closed so that the gate terminal of PB1 is coupled to node 111 for receiving VT, the drain terminal of PB1 is coupled to node 716 for developing the negative output signal $\overline{VOUT}$, the gate terminal of PB2 is coupled to node 113 for receiving VREF, and the drain terminal of PB2 is coupled to node 714 for developing the positive output signal VOUT. VREF is again increased to VH and the capacitor 118 charges to increase VT. When VT rises to VREF, CLK is asserted high, VREF is decreased to VL and the capacitor 118 discharges to decrease VT.

When VT falls to VREF at subsequent time t4, CLK and S2 are both asserted low while S2C is asserted high so that the differential pair 732 remains coupled but is chopped. In particular, while the switches 770 and 772 remain open, the switches 756, 758, 764, and 766 are closed so that the gate terminal of PB1 is coupled to node 113 for receiving VREF, the drain terminal of PB1 is coupled to node 714 for developing the positive output signal VOUT, the gate terminal of PB2 is coupled to node 111 for receiving VT, and the drain terminal of PB2 is coupled to node 716 for developing the negative output signal $\overline{VOUT}$. In effect, the transistors PB1 and PB2 are swapped with each other for the next CLK cycle. The cycle is substantially repeated, in which VREF is increased to VH and the capacitor 118 charges to increase VT. When VT rises to VREF, CLK goes high, VREF is decreased to VL and the capacitor discharges to decrease VT.

When VT falls to VREF at subsequent time t5, the entire process is repeated in which the differential pair 730 is once again coupled back into the comparator 701 to repeat a normal cycle and a chopped cycle for 2 CLK cycles, and then the differential pair 732 is again coupled back into the comparator 701 to repeat a normal cycle and a chopped cycle for 2 more CLK cycles. The swapping of duplicate differential transistor pair circuit blocks reduces the overall error for improved operation in a similar manner as swapping the entire comparator block circuit. The duplication and swapping of a differential transistor pair of a comparator circuit block provides several advantages over duplicating and swapping the entire comparator circuit block. The area and power penalty is significantly reduced since significant portions of the comparator circuit, such as the bias circuit 710, the output circuit 718, etc., need not be replicated.

In addition to swapping duplicate circuit blocks, the process of "chopping" may be performed on each circuit block while coupled to reduce noise even further. A circuit block is applicable for chopping when in a symmetrical configuration and when voltage offsets caused by many factors including RTN exist, such as, for example, a differential transistor pair. Chopping includes reversing or swapping connection of devices in the circuit block to cancel out some of the offset to attenuate noise that is well below the frequency of chopping. Chopping may be applicable to other circuit blocks such as the entire oscillator or even the comparator of the oscillator although circuit area and power penalties apply.

Figure 9:
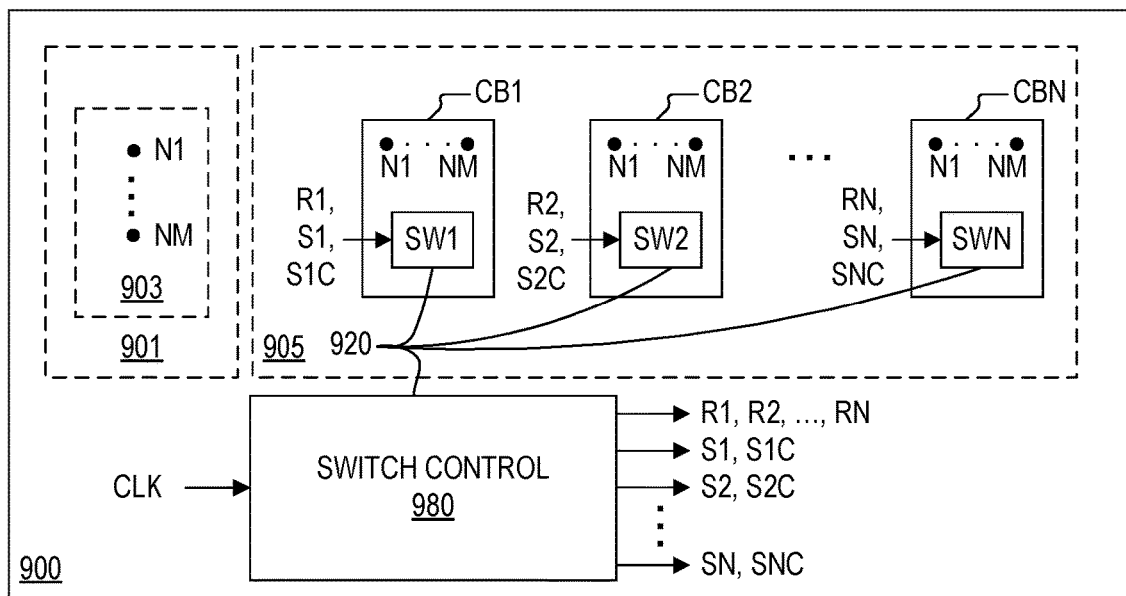
FIG. 9 is a simplified block diagram of yet another IC implemented with a system and method of duplicate circuit block swapping for noise reduction according to a more generalized configuration and for any number N of duplicate circuit blocks.

Although only two differential pairs are shown for swapping and chopping, any number N of differential pairs may be included with additional switching circuitry for swapping and chopping. As shown in FIG. 9, for example, an IC 900 includes a functional circuit 901 (e.g., audio circuit, oscillator, comparator, etc.) which further includes a sub-circuit 903 including or otherwise coupled to one or more nodes, such as a number M of nodes N1, . . . , NM, in which M is at least 1. A circuit area 905 includes N duplicate circuit blocks CB1, CB2, . . . , CBN, each including or otherwise configured to couple to the M nodes of the sub-circuit 903 to complete the sub-circuit 903. A switch control circuit 980 is included for providing select control signals S1, S2, . . . , SN, and for further providing reset control signals R1, R2, . . . , RN (if necessary or desired), and chop select signals S1C, S2C, . . . , SNC (if desired). The reset control signals R1-RN are provided if it is desired to place non-coupled ones of the circuit blocks CB1-CBN in a reset mode. The chop select signals S1C-SNC are provided if the circuit blocks CB1-CBN are symmetrical (e.g., differential transistor pair) and if chopping is desired.

The IC 900 includes a switch circuit 920, which includes the switch control circuit 980 and a set of N switching circuits SW1, SW2, . . . , SWN. The switching circuits SW1-SWN may be implemented with any type of switching devices or combinations thereof, such as including analog multiplexers, SPST switches, etc. The switching circuits SW1-SWN receive corresponding control signals from the switch control circuit 980 for coupling a corresponding one of the circuit blocks CB1-CBN to the sub-circuit 903 of the functional circuit 901. As shown, for example, control signals R1, S1, and S1C are provided to the switching circuit SW1 for controlling the coupling of the circuit block CB1, control signals R2, S2, and S2C are provided to the switching circuit SW2 for controlling the coupling of the circuit block CB2, and so on up to control signals RN, SN, and SNC which are provided to the switching circuit SW1 for controlling the coupling of the circuit block CBN.

Figure 10:
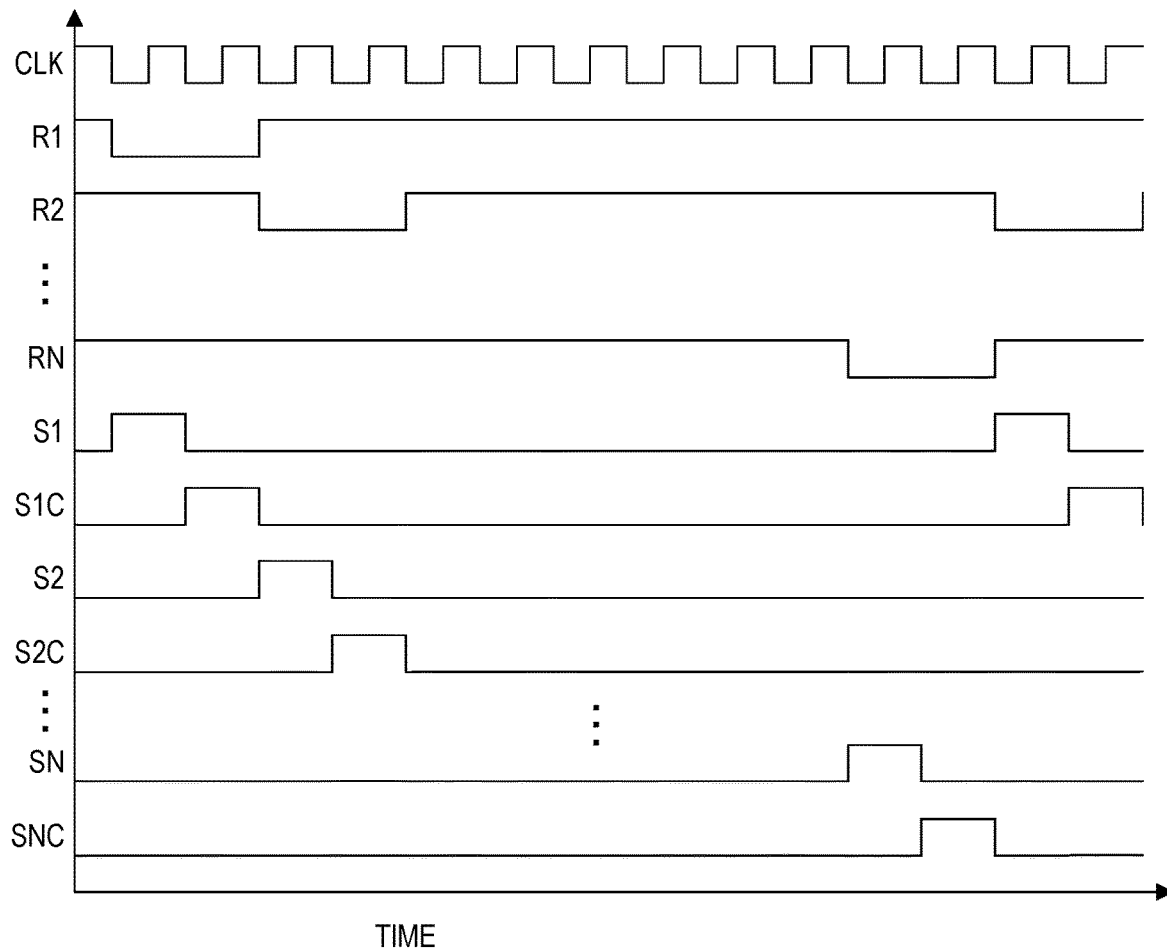
FIG. 10 is a timing diagram plotting clock and control signals versus time illustrating operation of the switch control circuit of FIG. 9 for controlling the switches of the corresponding switch circuit according to one embodiment.

FIG. 10 is a timing diagram plotting CLK and the control signals R1-RN, S1-SN and S1C-SNC versus time illustrating operation of the switch control circuit 980 for controlling the switches of the switch circuit 920 according to one embodiment. Operation is similar to that of FIG. 8 except extended to N circuit blocks CB1-CBN. R1 (if reset is included) goes low to pull CB1 out of reset, and S1 goes low for at least one cycle of CLK to couple the M nodes of CB1 into the M nodes of the sub-circuit 903 during that clock cycle. If chopping is applicable and desired, S1 is pulled low and S1C is asserted high while R1 remains low for at least one more cycle of CLK to again couple the M nodes of CB1 into the M nodes of the sub-circuit 903 in reverse or swapped order according to chop operation. Then R2 goes low to pull CB2 out of reset, and S2 and S2C are asserted in sequential CLK cycles as shown to couple the M nodes of CB2 into the M nodes of the sub-circuit 903 during the next CLK clock cycles. Operation continues in this manner up to RN, which goes low to pull CBN out of reset, and SN and SNC are asserted in sequential CLK cycles as shown to couple the M nodes of CBN into the M nodes of the sub-circuit 903 during the next CLK clock cycles. After each of the N circuit blocks CB1-CBN are coupled in this manner, operation repeats in which R1 is again asserted for coupling CB1 once again.

The inclusion and swapping of N duplicate circuit blocks integrated in close proximity to each other further reduces the overall error for improved operation. The swapping (or substitution) of 2 duplicate circuit blocks in proximity as shown in FIGS. 3 (entire oscillator), 5 (oscillator comparator) and 7 (comparator differential pair) reduces error by a factor of at least $\sqrt{2}$ and possibly by a factor of up to 2. When N is greater than 2, such as, for example, N=8, then swapping may reduce error cause by RTN by a factor of at least $\sqrt{8}$ (if RTN follows statistics of a gaussian random process) up to a factor of 8 (if RTN is deterministic). It is noted that when RTN follows statistics of a gaussian random process, more than one even up to all of the duplicate circuit blocks may be affected by RTN even if less likely. Even so, because of the random nature of RTN, circuit block swapping still reduces overall noise and error because of the random statistical distribution of the noise. In particular, swapping between N duplicate circuit blocks tends to cancel out at least a portion of the noise thereby attenuating overall noise resulting in an average reduction factor of $\sqrt{N}$. Statistically speaking, even when N is large, such as 8, the more likely condition is that only one of the duplicate circuit blocks is affected by RTN so that the reduction factor may be as high as 8.

Although N may be as large as physically feasible or possible, the tradeoff is that increasing the value of N increases the number of duplicate circuits and increases the size of the switch circuit including corresponding switches and a switch controller or the like. The size of the duplicate circuit may be limited to only those devices that are susceptible to RTN and that also impact overall circuit operation (e.g., timing).

Although the present invention has been illustrating in the present disclosure using clock circuits or those circuits used for purposes of timing, the present invention is applicable to other types of circuits in which RTN may be a factor affecting overall performance. RTN affecting an amplifier in an audio circuit, for example, may cause an increase in undesired low frequency noise. The circuit that is susceptible to RTN may be duplicated and swapped in accordance with that described herein to reduce noise and improve performance.

Figure 11:
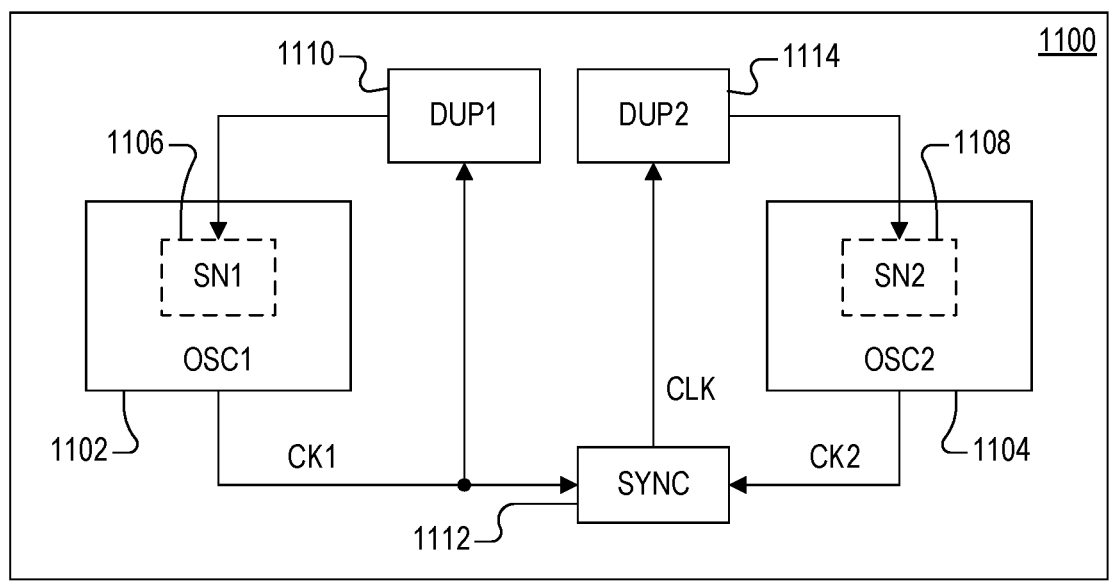
FIG. 11 is a simplified block diagram of another IC implemented according to another embodiment of the present disclosure including first and second oscillator circuits.

FIG. 11 is a simplified block diagram of another IC 1100 implemented according to another embodiment of the present disclosure. The IC 1100 includes a first oscillator circuit 1102 (OSC1) and a second oscillator circuit 1104 (OSC2). The first oscillator circuit 1102 includes a set of one or more "swapping" nodes (SN1) 1106 and the second oscillator circuit 1104 also includes a set of one or more swapping nodes (SN2) 1108. A "swapping" node is a node that is switched between different duplicate electronic circuits or devices in successive switching cycles or states as further described herein. The first oscillator circuit 1102 generates a first clock signal CK1 and the second oscillator circuit 1104 generates a second clock signal CK2. The oscillator circuits 1102 and 1104 each represent any type of functional circuit that may include electronic circuits or electronic devices susceptible to RTN. It is understood that a system and method of duplicate circuit block swapping for noise reduction as described herein is not limited to oscillator or clock circuits or the like.

CK1 is provided to an input of a first duplication circuit (DUP1) 1110 and to a first input of a synchronization (SYNC) circuit 1112. As described further herein, the DUP1 circuit 1110 controls selection and coupling from among a first set of duplicate electronic circuits for electrically coupling the selected duplicate electronic circuits to the SN1 swapping nodes 1106 of the first oscillator circuit 1102. CK2 is provided to a second input of the synchronization circuit 1112, having an output providing a synchronized clock signal CLK to an input of a second duplication (DUP2) circuit 1114. As described further herein, the DUP2 circuit 1114 controls selection and coupling from among a second set of duplicate electronic circuits for electrically coupling the selected duplicate electronic circuits to the SN2 swapping nodes 1108 of the second oscillator circuit 1104.

The clock signals CK1 and CK2 may be asynchronous with respect to each other. The synchronization circuit 1112 generates CLK based on CK1 but synchronized with CK2 to minimize disruption of operation of the second oscillator circuit 1104 during swapping and/or chopping of duplicate circuitry. Specific operation of the synchronization circuit 1112 is not further described. Generally, CK1 is used directly to synchronize swapping and chopping of duplicate circuitry of the DUP1 circuitry 1110 to the SN1 swapping nodes 1106, and is also used indirectly, via synchronized version CLK, to synchronize swapping and chopping switching duplicate circuitry of the DUP2 circuitry 1112 to SN2 swapping nodes 1108.

Figure 12:
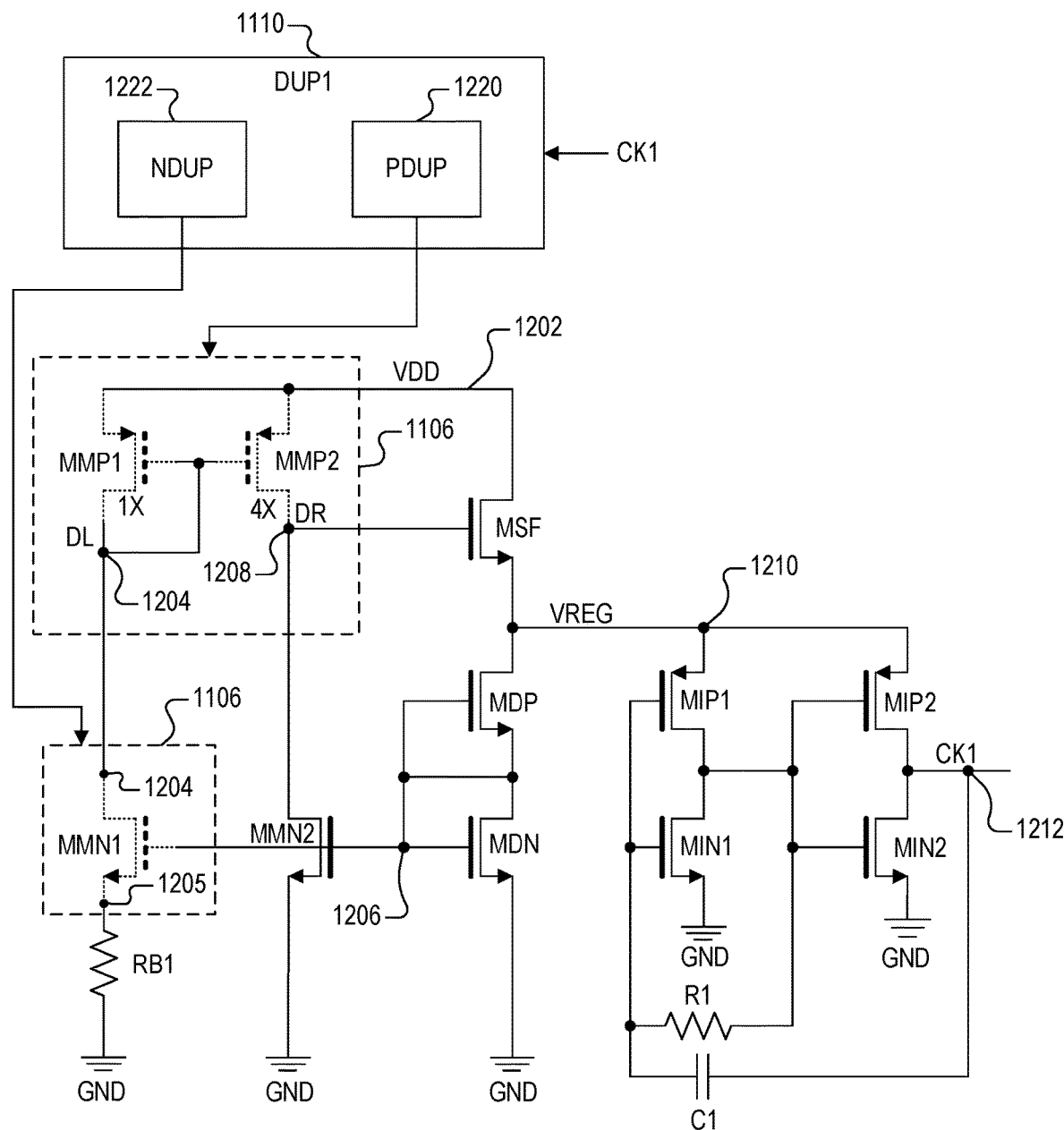
FIG. 12 is a schematic diagram of the first oscillator circuit of FIG. 11 interfacing the duplication circuitry of FIG. 11 according to one embodiment of the present disclosure.

FIG. 12 is a schematic diagram of the first oscillator circuit 1102 interfacing the DUP1 circuitry 1110 according to one embodiment of the present disclosure. A supply node 1202 receives a supply voltage VDD, which is coupled to source terminals of a pair of PMOS transistors MMP1 and MMP2 and to a drain terminal of an NMOS transistor MSF. Gate and drain terminals of MMP1 are coupled together at a left drain (DL) node 1204, which is further coupled to a drain terminal of another NMOS transistor MMN1. A gate terminal of MMN1 is coupled to a gate node 1206 and its source terminal is coupled to one end of a resistor RB1 at a node 1205. The other end of the resistor RB1 is coupled to GND. A drain terminal of MMP2 is coupled to a right drain (DR) node 1208, which is further coupled to a gate terminal of MSF and to a drain terminal of another NMOS transistor MMN2. A gate terminal of MMN2 is coupled to the gate node 1206 and its source terminal is coupled to GND.

A source terminal of MSF is coupled to a regulated voltage (VREG) node 1210, which is further coupled to source terminals of additional PMOS transistors MDP, MIP1, and MIP2. Gate and drain terminals of MDP are coupled together at the gate node 1206, which is further coupled to gate and drain terminals of another NMOS transistor MDN, having its source terminal coupled to GND. A drain terminal of MIP1 is coupled to gate terminals of MIP2 and another NMOS transistor MIN2, to a drain terminal of another NMOS transistor MIN1, and to one end of a resistor R1. Gate terminals of MIP1 and MIN1 are coupled together at the other end of the resistor R1 and to one end of a capacitor C1. Source terminals of MIN1 and MIN2 are coupled to GND. Drain terminals of MIP2 and MIN2 are coupled together at an output node 1212 developing the clock signal CK1, in which the output node 1212 is further coupled to the other end of the capacitor C1.

Specific operation of the oscillator circuit 1102 is not further described other than to state that it is an example of a precision temperature stable oscillator operating at a selected frequency. In one embodiment, the oscillator circuit 1102 generates CK1 to have a selected stable frequency of about 32 to 33 Kilohertz (KHz) within a relatively wide operating temperature range.

The transistors MMP1, MMP2, and MMN1 are shown with dashed lines within the area of the SN1 swapping nodes 1106. These transistors are examples of transistors of the oscillator circuit 1102 that may be subject to RTN and thus are used to illustrate swapping and/or chopping to minimize RTN impact. As described further herein, the DUP1 circuit 1110 includes PDUP circuitry 1220 which contains a number of duplicate PMOS transistors that are coupled to and decoupled from of the SN1 swapping nodes 1106 to implement the PMOS transistors MMP1 and MMP2. The DUP1 circuit 1110 further includes NDUP circuitry 1222 which contains a number of NMOS transistors that are coupled to and decoupled from of the SN1 swapping nodes 1106 to implement the NMOS transistor MMN1. Although not specifically shown herein, it is noted that other ones of the transistors, such as MMN2 and/or MDP, etc., may also be susceptible to RTN and may also be selected from duplicate transistors within the DUP1 circuit 1110. The swapping and/or chopping to realize the transistors MMP1, MMP2 and MMN1 may be applied to any of the other electronic devices of the oscillator circuit 1102 that may be subject to RTN in similar manner.

In one embodiment, the duplicate transistors of the selected transistors MMP1, MMP2, and MMN1 are switched in and out in their entireties, meaning at their gate, source and drain terminals. In another embodiment, the DUP1 circuit 1110 may include one or more common nodes that remain coupled to each of the duplicate devices so that a selected subset of the nodes are swapping nodes. For example, as further described herein, each of the duplicate transistors for the PMOS transistors MMP1 and MMP2 have their source terminals coupled to the supply node 1202 and their gate terminals coupled to the DL node 1204 within the DUP1 circuit 1110, so that only their drain terminals are selectively coupled to either the DL node 1204 or the DR node 1208 to implement the respective transistors. Thus, nodes 1204 and 1208 are the swapping nodes for MMP1 and MMP2. Each of the duplicate transistors for the NMOS transistor MMN1 has its gate terminal coupled to the gate node 1206 within the DUP1 circuit 1110, so that its drain terminal is selectively coupled to the DL node 1204 and the source terminal is selectively coupled to node 1205. Thus, the nodes 1204 and 1205 are swapping nodes for MMN1.

In the illustrated embodiment, MMP2 is four times the size of MMP1, as indicated by "4×" for MMP2 and "1×" for MMP1. In this case, four of the duplicate PMOS transistors in the PDUP circuitry 1220 are selected at a time and coupled in parallel to implement MMP2 while only one of the duplicate PMOS transistors is selected at a time to implement MMP1.

Figures 13, 14:
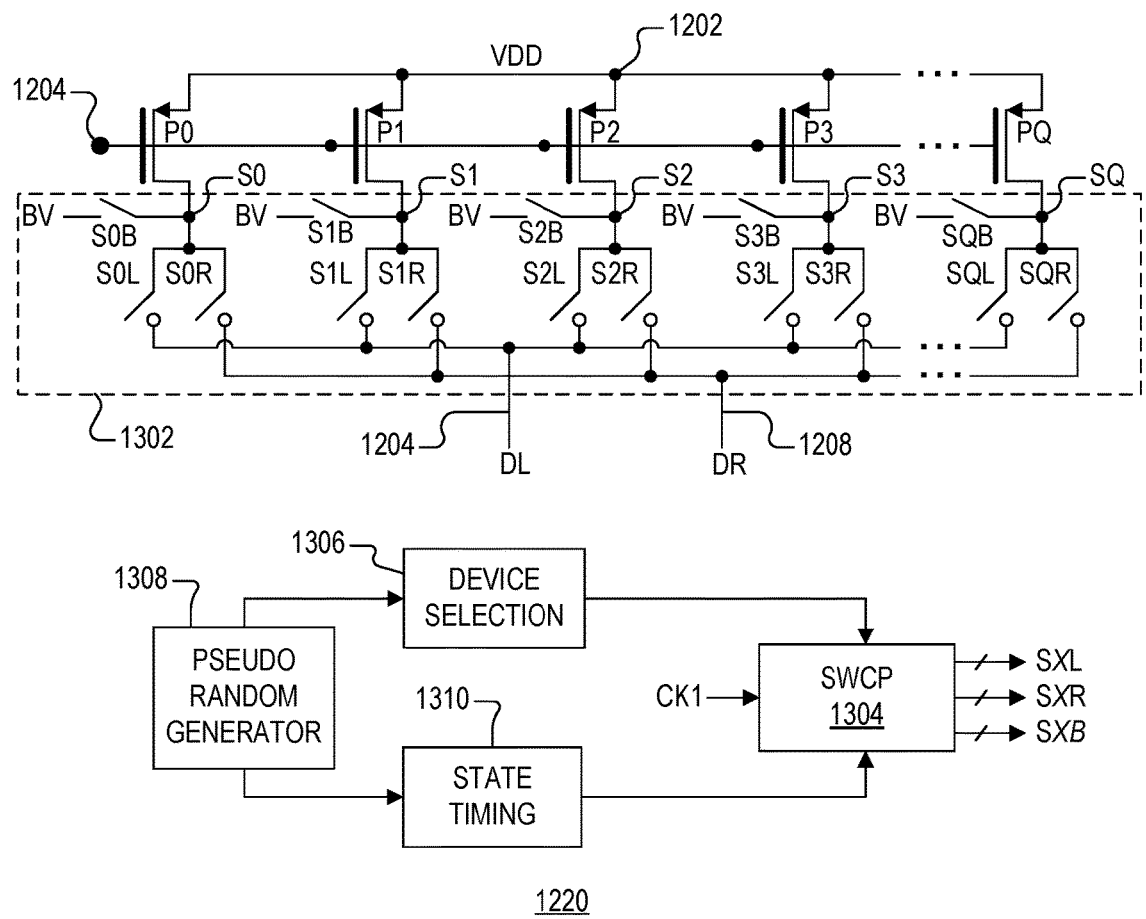
FIG. 13 is a schematic and block diagram of a portion of the duplication circuitry for implementing PMOS transistors of the first oscillator circuit according to one embodiment of the present disclosure.
FIG. 14 is a table illustrating swapping and chopping of PMOS transistors of the first oscillator circuit in sequential states and round-robin fashion according to one embodiment of the present disclosure.

FIG. 13 is a schematic and block diagram of a portion of the PDUP circuitry 1220 for implementing MMP1 and MMP2 according to one embodiment of the present disclosure. A string of Q+1 duplicate PMOS transistors P0, P1, P2, P3, ..., PQ (P0-PQ) are provided for implementing both of the transistors MMP1 and MMP2 of the oscillator circuit 1102. The transistors P0-PQ are integrated onto the IC 1100 in close proximity with each other in a similar manner as previously described. It is noted that "Q" is an integer and that the total number of duplicate transistors, or Q+1, is greater than the minimum number of transistors need for implementing the functional circuit transistors, including one transistor for MMP1 and four transistors for MMP2 (e.g., Q is at least 5). The number transistors, however, may be significantly greater than the actual number of transistors needed in each subset, in which a larger number is used to reduce or minimize impact of RTN. During operation of the oscillator circuit 1102, a subset of transistors P0-PQ is selected to include one duplicate transistor for MMP1 and four duplicate transistors for MMP2 for each of multiple switching states during operation.

In the illustrated configuration, the source terminals of the transistors P0-PQ are coupled to the supply node 1202, the gate terminals are coupled to the DL node 1204, and the drain terminals are coupled to a corresponding one of Q+1 switch nodes S0, S1, S2, S3, ..., SQ (S0-SQ). Each of the switch nodes S0-SQ is a common node of a corresponding one of Q switch circuits 1302, in which each of the Q switch circuits 1302 includes three SPST switches. For each of the switch circuits 1302, a first SPST switch is controlled by a corresponding switch signal SXL for selectively coupling the corresponding switch node (and thus the drain of the corresponding transistor) to the swapping DL node 1204 for implementing MMP1, a second SPST switch is controlled by a corresponding switch signal SXR for selectively coupling the corresponding switch node to the swapping DR node 1208 for implementing MMP2, and a third SPST switch is controlled by a corresponding switch signal SXB for selectively coupling the corresponding switch node to a bias node developing a bias voltage BV for deselecting the transistor and removing it from the circuit, in which "X" is an index value from 0 to Q. Coupling the drain terminal of each unused transistor to a bias node with a bias voltage minimizes the impact of capacitance of the corresponding gate terminals on the oscillator circuit 1102. The bias voltage BV may be any suitable bias voltage level including GND.

A switch control circuit SWCP 1304 receives the clock signal CK1 and provides the control signals SXL, SXR, and SXB to control each of the SPST switches of the switch circuits 1302 for selecting a subset from among the duplicate transistors P0-PQ for implementing MMP1 and MMP2. In one embodiment, the switch control circuit SWCP 1304 may select the next sequential 5 of the transistors P0-PQ in round-robin fashion in sequential cycles of CK1. A device selection block 1306 may be provided to control selecting a subset of the transistors P0-PQ. The device selection block 1306 may be programmed for the simple round-robin selection process. The device selection block 1306 may alternatively be used, however, for more complex selection functions, such as every other transistor or every third transistor or any other transistor combination as may be determined. A pseudo-random generator 1308 may be included and used by the device selection block 1306 for randomly selecting a subset from among the transistors P0-PQ in successive swap and/or chop states.

The switch control circuit SWCP 1304 may change state, and thus selection from among the transistors P0-PQ, based on successive cycles of CK1. A state timing block 1310 may be included to implement more complex timing, such as every other clock cycle, every third clock cycle, etc. In addition, the state timing block 1310 may use the pseudo-random generator 1308 to randomize timing between switching states so that each state has a random duration from one state to the next. Random values provided by the pseudo-random generator 1308, for example, may be used to determine a random number of CK1 cycles for each state. The duration of each state may be randomly selected between minimum and maximum time values or CK1 clock cycles.

The pseudo-random generator 1308 may be used in combination for both device selection and state timing. In this manner, the transistors P0-PQ may be randomly selected for each state, and each state may have a randomly selected duration. A larger value for Q, such as 15, 31, or 63 or the like minimizes the potential impact of RTN on the oscillator circuit 1102. It is noted that the term "pseudo-random" is also known as "quasi-random."

FIG. 14 is a table illustrating swapping and chopping of the transistors P0-PQ for implementing MMP1 and MMP2 in sequential states and round-robin fashion according to one embodiment of the present disclosure. The incremental states are listed in the left column beginning with an arbitrary state "N" and advancing to state N+1, then to state N+2, and so on. The advance from one state to the next may be based on sequential cycles of the clock CK1, or the states may have random durations as previously described such as based on random numbers of CK1 clock cycles. The transistors P0-PQ are listed along the top row. Each square is filled with either value MMP1 or MMP2 to indicate which one of the transistors MMP1 or MMP2, respectively, the duplicate transistor implements for a given state, or is filled with dashed lines "- - -" indicating that the transistor is not used for the indicated state.

In the first state N, transistors P0 and P1 and P7-PQ are not used, P2 is selected to implement MMP1, and the four transistors P3-P6 are selected to implement MMP2. With reference to FIG. 13, this means that signal S2L is asserted to couple the drain terminal of P2 to the node DL 1204, and that signals S3R, S4R, S5R, and S6R are asserted to couple the drain terminals of P3-P6 to the DR node 1208. The drain terminals of the unused transistors P0-P1 and P7-PQ are coupled to ground. In the next state N+1, P2 is switched out of the circuit and thus unused, P3 is selected to implement MMP1, and transistors P4-P7 are selected to implement MMP2. It is noted that from state N to state N+1, transistor P3 is chopped from MMP2 to MMP1, the transistors P4-P6 remain selected (no switching), and transistor P7 is selected for MMP2. In the next state N+2, P3 is switched to unused, P4 is selected to implement MMP1, and transistors P5-P8 are selected to implement MMP2. It is noted that from state N+1 to state N+2, transistor P4 is chopped from MMP2 to MMP1, the transistors P5-P7 remain selected, and transistor P8 is selected for MMP2. Operation continues in similar manner in successive states according to a round-robin configuration, in which the selected transistors wrap around from the last transistor PQ back to the first transistor P0.

Figures 15, 16:
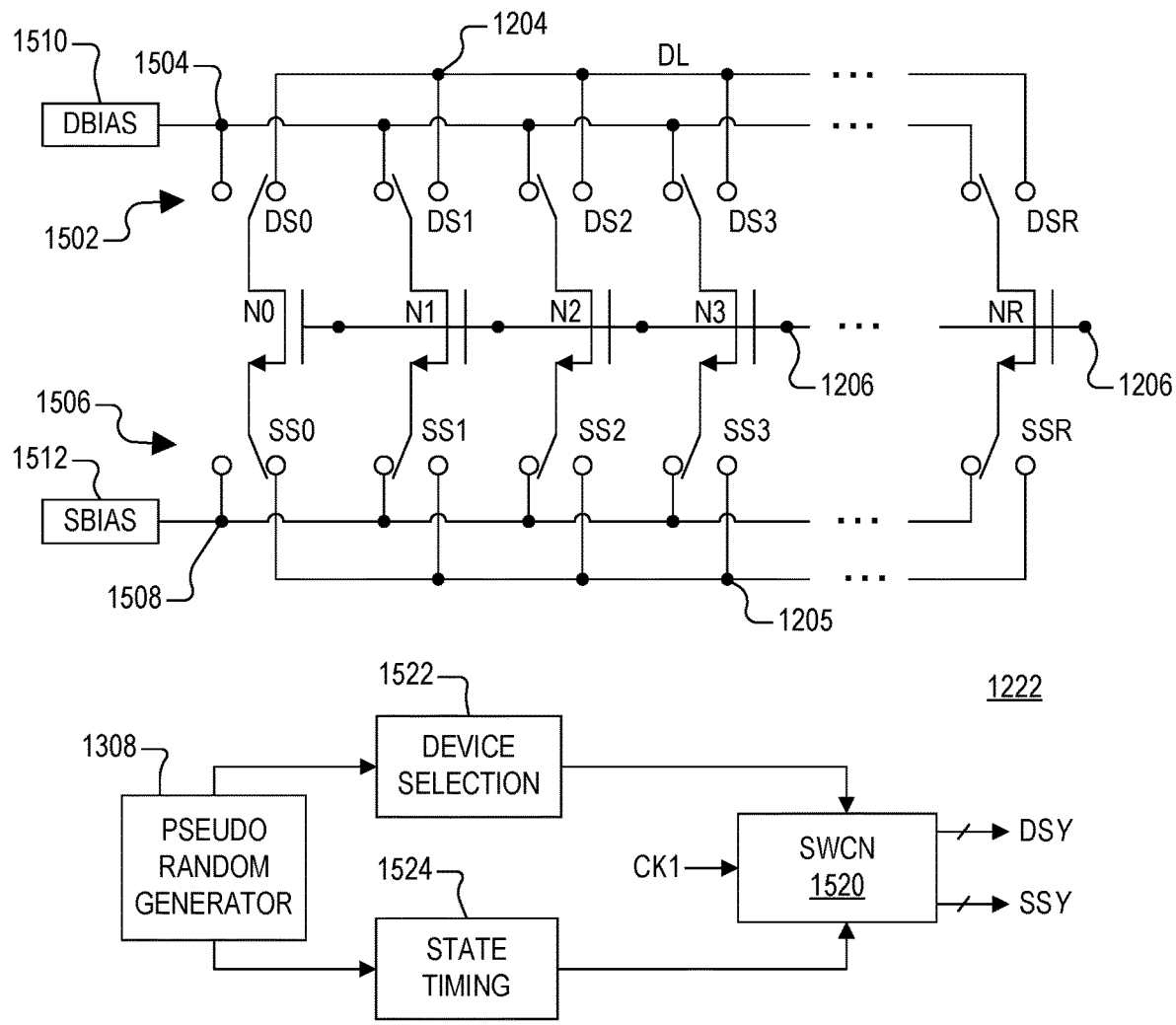
FIG. 15 is a schematic and block diagram of the duplication circuitry of FIG. 12 for implementing an NMOS transistor of the first oscillator circuit according to one embodiment of the present disclosure.
FIG. 16 is a table illustrating swapping NMOS transistors for implementing an NMOS transistor of the first oscillator circuit in sequential states and round-robin fashion according to one embodiment of the present disclosure.

FIG. 15 is a schematic and block diagram of the NDUP circuitry 1222 for implementing MMN1 using duplicate NMOS transistors according to one embodiment of the present disclosure. A string of R+1 duplicate NMOS transistors N0, N1, N2, N3, . . . , NR (N0-NR) are provided for implementing MMN1 of the oscillator circuit 1102, in which "R" is an integer greater than one and where one of the transistors N0-NR is selected at a time to implement MMN1 for each of multiple states. The transistors N0-NR are integrated onto the IC 1100 in close proximity with each other in a similar manner as previously described. In this case, the gate terminals of the transistors N0-NR are coupled to the gate node 1206. A first set of R+1 single-pole, double-throw (SPDT) switches 1502, controlled by corresponding switch signals DS0, DS1, . . . , DSR (DS0-DSR), is provided for coupling the drain terminal of a selected one of the transistors N0-NR to the swapping DL node 1204. The set of SPDT switches 1502 couple the remaining unselected ones of the transistors N0-NR to a first bias node 1504.

A second set of R+1 SPDT switches 1506, controlled by corresponding switch signals SS0, SS1, . . . , SSR (SS0-SSR), is provided for coupling a source terminal of the selected one of the transistors N0-NR to the swapping node 1205. The SPDT switches 1506 couple the remaining unselected ones of the transistors N0-NR to a second bias node 1508. For purposes of illustration, the transistor N0 is shown as selected in which the signals DS0 and SS0 are asserted to couple the drain terminal of N0 to the DL node 1204 and to couple the source terminal of N0 to node 1205. The drain terminals of the remaining transistors N1-NR are coupled to the first bias node 1504 by the remaining switches 1502, having their source terminals coupled to the second bias node 1508 by the remaining switches 1506.

A first bias circuit 1510 drives the first bias node 1504 to a first bias level DBIAS, and a second bias circuit 1512 drives the second bias node 1508 to a second bias level SBIAS. Thus, the drain and source terminals of the unselected ones of the transistors N0-NR are thus driven to bias levels DBIAS and SBIAS, respectively. DBIAS and SBIAS may be driven to any suitable bias voltage levels to minimize impact of unselected transistors on the first oscillator circuit 1102. One or both DBIAS and SBIAS may be GND.

A switch control circuit SWCN 1520 receives the clock signal CK1 and provides the control signals DSY and SSY to control each of the switches 1502 and 1506 for selecting a subset of the duplicate transistors N0-NR for implementing MMN1, in which "Y" is an index value from 0 to R and in which each subset includes only one transistor. In one embodiment, the switch control circuit SWCN 1520 may select the next one of the transistors N0-NR in round-robin fashion in sequential cycles of CK1. A device selection block 1522 may be provided to control selection of the transistors N0-NR. The device selection block 1522 may be programmed for the simple round-robin selection process, or may alternatively be used for more complex selection functions, such as every other transistor or every third transistor or any other transistor grouping as may be determined. The pseudo-random generator 1308 may be used by the device selection block 1522 for randomly selecting from among the transistors N0-NR in successive swap and/or chop states.

The switch control circuit SWCN 1520 may change state, and thus selection from among the transistors N0-NR, based on successive cycles of CK1. A state timing block 1524 may be included to implement more complex timing for each switching or swapping state, such as every other clock cycle, every third clock cycle, etc. In addition, the state timing block 1524 may use the pseudo-random generator 1308 to randomize duration of the switching states so that each state has a random duration (e.g., random number of CK1 cycles for each state). The duration of each state may be randomly selected between minimum and maximum time values or CK1 clock cycles.

In a similar manner as previously described, pseudo-random generator 1308 may be used in combination for both device selection and state timing. In this manner, one of the transistors N0-NR may be randomly selected for each state, and each state may have a randomly selected duration. The integer number R may be any suitable integer greater than one. A larger value for R, such as 15, 31 or 63 or the like, minimizes the potential impact of RTN on the oscillator circuit 1102.

FIG. 16 is a table illustrating swapping the transistors N0-NR for implementing MMN1 in sequential states and round-robin fashion according to one embodiment of the present disclosure. As described for FIG. 14, the incremental states are listed in the left column beginning with a state "N" and advancing to state N+1, then to state N+2, and so on. The advance from one state to the next may be based on sequential cycles of the clock CK1, or the states may have random durations as previously described. The transistors N0-NR are listed along the top row. Each square is either filled with the value MMN1 to indicate it is selected to implement the transistor MMN1, or is filled with dashed lines "- - -" indicating that the transistor is not used for the indicated state.

In the first state N, transistors N0-N1 and N3-NR are not used, and N2 is selected to implement MMN1. With reference to FIG. 15, this means that signal D S2 is asserted to couple the drain terminal of N2 to the swapping DL node 1204, and that the signal SS2 is asserted to couple the source terminal of N2 to the swapping node 1205. The remaining DSY and SSY signals are de-asserted so that the drain and source terminals of the unused transistors N0-N1 and N3-NR are coupled to DBIAS and SBIAS, respectively. In the next state N+1, N2 is switched to unused and N3 is next selected to implement MMN1. In the next state N+2, N3 is switched to unused and N4 is next selected to implement MMN1. Operation continues in similar manner in successive states according to a round-robin configuration, in which the selected transistors wrap around from the last transistor NR back to the first transistor N0.

Figure 17:
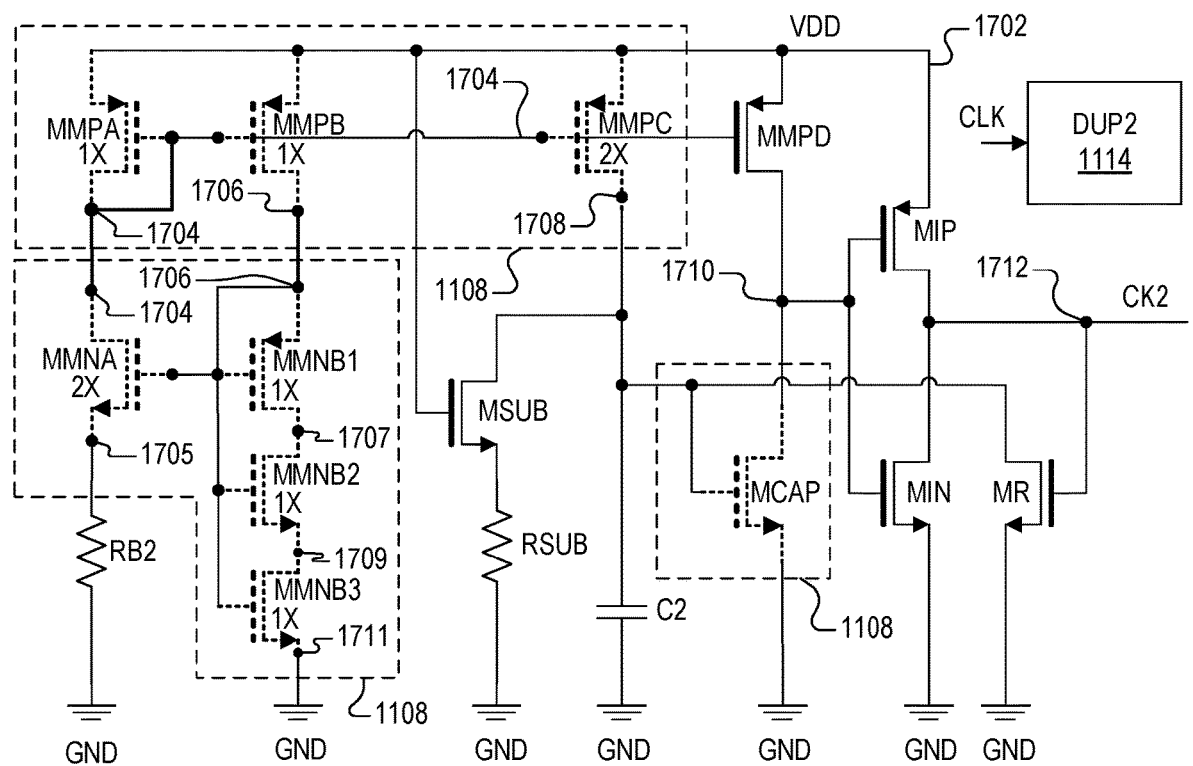
FIG. 17 is a schematic diagram of the second oscillator circuit of FIG. 11 interfacing duplication circuitry according to one embodiment of the present disclosure.

FIG. 17 is a schematic diagram of the second oscillator circuit 1104 interfacing the DUP2 circuitry 1114 according to one embodiment of the present disclosure. A supply node 1702 receiving the supply voltage VDD is coupled to source terminals of PMOS transistors MMPA, MMPB, MMPC, MMPD, and MIP. Gate terminals of the transistors MMPA, MMPB, MMPC, and MMPD are coupled together at a node 1704. A drain terminal of MMPA is also coupled to node 1704 and to a drain terminal of an NMOS transistor MMNA. A source terminal of MMNA is coupled to one end of a resistor RB2 at a node 1705, in which the other end of RB2 is coupled to GND. A drain terminal of MMPB is coupled to a node 1706, which is further coupled to gate and drain terminals of another NMOS transistor MMNB1, having its source terminal coupled to a node 1707. Node 1707 is coupled to the drain terminal of another NMOS transistor MMNB2, having its gate terminal coupled to node 1706 and its source terminal coupled to a node 1709. Node 1709 is coupled to the drain terminal of another NMOS transistor MMNB3, having its gate terminal coupled to node 1706 and its source terminal coupled to a node 1711 which is coupled to GND.

Another NMOS transistor MSUB has its gate terminal coupled to supply node 1702, its drain terminal coupled to a node 1708, and its source terminal coupled to one end of a resistor RSUB. The other end of RSUB is coupled to GND. Node 1708 is further coupled to a drain terminal of MMPC, to one end of a capacitor C2, to a gate terminal of another NMOS transistor MCAP, and to a drain terminal of another NMOS transistor MR. The other end of C2 is coupled to GND. A drain terminal of MMPD is coupled to a node 1710, which is further coupled to a gate terminal of MIP, to a drain terminal of MCAP, and to a gate terminal of another NMOS transistor MIN. A drain terminal of MIP is coupled to an output node 1712 developing the output clock signal CK2. The output node 1712 is further coupled to a drain terminal of MIN and to a gate terminal of MR. Source terminals of MCAP, MIN and MR are coupled to GND.

Specific operation of the oscillator circuit 1104 is not further described other than to state that it is an example of a precision, temperature sensitive oscillator operating at a nominal frequency that varies with temperature. In one embodiment, the oscillator circuit 1104 generates CK2 to have a nominal frequency of about 5 Megahertz (MHz) that varies with temperature within a relatively wide operating temperature range. Such an oscillator may be useful for tracking ambient temperature and adjusting operation of functional circuitry accordingly.

MMPA, MMPB, MMPC, MMNA, MMNB1, MMNB2, MMNB3, and MCAP are shown with dashed lines within the area of the SN2 swapping nodes 1108 as examples of transistors of the oscillator circuit 1102 that are subject to RTN. The DUP2 circuit 1114 includes corresponding PMOS and NMOS transistors that are switched into and out of the SN2 swapping nodes 1108 for implementing the transistors MMPA, MMPB, MMPC, MMNA, MMNB1, MMNB2, MMNB3, and MCAP in a similar manner as described for the DUP1 circuit 1110. Although not specifically shown herein, it is noted that other ones of the transistors, such as MSUB and/or MMPD, etc., may also be susceptible to RTN and may also be selected from duplicate transistors within the DUP2 circuit 1114. The transistors MMPA, MMPB, MMPC, MMNA, MMNB1, MMNB2, MMNB3, and MCAP are used to illustrate swapping and/or chopping that may be applied to any of the electronic devices of the oscillator circuit 1104 in similar manner.

The details of the DUP2 circuit 1114 are not shown or described, yet are similar to that shown and described for the DUP1 circuit 1110 except based on the synchronized clock signal CLK. The DUP2 circuit 1114 includes a set of duplicate PMOS transistors that are integrated in close proximity with each other, and further includes corresponding switch and control circuitry for switching duplicate circuitry in and out for implementing the transistors MMPA, MMPB, and MMPC. MMPD may be included as well in another embodiment. MMPC is twice (2×) the size of MMPA (1×) and MMPB (1×), so that 2 transistors are used for MMPC while one transistor is used for each of MMPA and MMPB. The duplicate PMOS transistors may be switched at all three terminals, but may also be switched only at the drain terminals in a similar manner described for MMP1 and MMP2 (in which the gate and source terminals are already coupled). In one embodiment, the nodes 1704, 1706 and 1708 may be swapping nodes for these transistors.

The DUP2 circuit 1114 also includes a first set of duplicate NMOS transistors integrated in close proximity with each other, and further includes corresponding switch and control circuitry for switching duplicate circuitry in and out for implementing the transistors MMNA, MMNB1, MMNB2, and MMNB3. It is noted that 2 transistors coupled in parallel are used for MMNA (2×) whereas 3 transistors coupled in series are used for MMNB1, MMNB2, MMNB3, each having size 1×. The duplicate NMOS transistors may be switched at all three terminals, but may also be switched at the drain and source terminals in a similar manner described for MMN1 and MMN2 (in which the gate terminals are already coupled). In one embodiment, the nodes 1704, 1705, 1706, 1707, 1709, and 1711 are swapping nodes for these transistors.

The DUP2 circuit 1114 also includes a second set of duplicate NMOS transistors integrated in close proximity with each other, and further includes corresponding switch and control circuitry for switching duplicate circuitry in and out for implementing the transistor MCAP. Again, the duplicate NMOS transistors may be switched at all three terminals, in which all three terminals are coupled at corresponding swapping nodes within the SN2 swapping nodes 1108. In one embodiment, the duplicate transistors for MCAP are only switched at the drain terminals (in which the gate and source terminals remain coupled), in which only the drain terminals are coupled to the swapping nodes.

FIG. 18 is a table illustrating swapping and chopping U+1 duplicate NMOS transistors NN0-NNU for implementing MMNA, and MMNB1-MMNB3 in sequential states and round-robin fashion according to one embodiment of the present disclosure. U is an integer greater than one, such as 15 one embodiment for a total of 16 duplicate transistors. Again, the incremental states are listed in the left column beginning with a state "N" and advancing to state N+1, then to state N+2, and so on. The advance from one state to the next may be based on sequential cycles of the clock CLK, or the states may have random durations as previously described. The transistors NN0-NNU are listed along the top row. Each square is filled with either value MMNA, MMNB1, MMNB2 or MMNB3 to indicate which one of the transistors the duplicate transistor implements for a given state, or is filled with dashed lines "- - - " indicating that the transistor is not used for the indicated state.

The 2 duplicate transistors NN2 and NN3 implement MMNA and the 3 duplicate transistors NN4-NN6 implement MMNB1-MMNB3 in the first state N. In the next state N+1, the 2 duplicate transistors NN3 and NN4 implement MMNA and the 3 duplicate transistors NN5-NN7 implement MMNB1-MMNB3. In the next state N+2, the 2 duplicate transistors NN4 and NN5 implement MMNA and the 3 duplicate transistors NN6-NN8 implement MMNB1-MMNB3. Operation continues in this manner in sequential states. Although not specifically shown, the switched terminals of unused duplicate transistors in each state may be coupled to bias voltages or circuitry to minimize impact of the functional circuitry.

FIG. 19 is a table illustrating swapping and chopping V+1 duplicate PMOS transistors PP0-PPV for implementing MMPA, MMPB, and MMPC in sequential states and round-robin fashion according to one embodiment of the present disclosure. V is an integer greater than one, such as 15 one embodiment for a total of 16 duplicate transistors. Again, the incremental states are listed in the left column beginning with a state "N" and advancing to state N+1, then to state N+2, and so on. The advance from one state to the next may be based on sequential cycles of the clock CLK, or the states may have random durations as previously described. The transistors PP0-PPV are listed along the top row. Each square is filled with one of values MMPA, MMPB, or MMPC to indicate which one of the transistors the duplicate transistor implements for a give state, or is filled with dashed lines "- - - " indicating that the transistor is not used for the indicated state.

The 2 duplicate transistors PP2 and PP5 collectively implement MMPC, the duplicate transistor PP3 implements MMPB, and the duplicate transistor PP4 implements MMPA in the first state N. In the next state N+1, the 2 duplicate transistors PP3 and PP6 collectively implement MMPC, the duplicate transistor PP4 implements MMPB, and the duplicate transistor PP5 implements MMPA. In the next state N+2, the 2 duplicate transistors PP4 and PP7 collectively implement MMPC, the duplicate transistor PP5 implements MMPB, and the duplicate transistor PP6 implements MMPA. Operation continues in this manner in sequential states. It is noted that any two or more duplicate transistors may be combined to implement a circuit transistor rather than sequential transistors. Although not specifically shown, the switched terminals of unused duplicate transistors in each state may be coupled to bias voltages or circuitry to minimize impact of the functional circuitry.

FIG. 20 is a table illustrating swapping 4 duplicate NMOS transistors NNN0-NNN3 for implementing MCAP in sequential states and round-robin fashion according to one embodiment of the present disclosure. In this case only 4 duplicate transistors are used although any number of duplicate transistors is contemplated in different configurations. Again, the incremental states are listed in the left column beginning with a state "N" and advancing to state N+1, then to state N+2, and so on. The advance from one state to the next may be based on sequential cycles of the clock CLK, or the states may have random durations as previously described. The transistors NNN0-NNN3 are listed along the top row. Each square is filled with a value MCAP when implementing MCAP for a give state, or is filled with dashed lines "- - - " indicating that the transistor is not used for the indicated state.

In this case, NNN0, NNN1, NNN2, and NNN3 implement MCAP in successive states N, N+1, N+2, and N+3, respectively. Only one duplicate transistor is used while the remaining ones are not used for each state. Operation continues in round-robin fashion, in which NNN0 once again implements MCAP in state N+4. Operation continues in this manner in sequential states. Although not specifically shown, the switched terminals of unused duplicate transistors in each state may be coupled to bias voltages or circuitry to minimize impact of the functional circuitry.

It is noted that the duplicate electronic circuits shown and described for the IC 1100 are either PMOS or NMOS transistor devices since such transistors are typically more susceptible to RTN. It is noted, however, that the present invention is not limited to transistor devices and may be applied to other electronic circuits and devices.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. An integrated circuit, comprising:
   a functional circuit including at least one swapping circuit node;
   a plurality of duplicate electronic circuits integrated on the integrated circuit in close proximity with each other, each comprising at least one electronic device that is susceptible to random telegraph noise (RTN); and
   a switch circuit that electrically couples a different selected subset of at least one of the plurality of duplicate electronic circuits to the at least one swapping circuit node for each of successive switching states during operation of the functional circuit.

2. The integrated circuit of claim 1, wherein each of the plurality of duplicate electronic circuits includes a plurality of terminals including at least one terminal that remains coupled to a corresponding at least one circuit node of the functional circuit during the successive switching states.

3. The integrated circuit of claim 2, wherein the switch circuit electrically couples a remaining one or more of the plurality of terminals of the selected subset of the plurality of duplicate circuits to corresponding one or more swapping circuit nodes of the functional circuit for each of the successive switching states.

4. The integrated circuit of claim 1, wherein:
   the functional circuit includes at least one first swapping circuit node and at least one second swapping circuit node; and
   wherein the switch circuit electrically couples a first subset of the plurality of duplicate electronic circuits to the at least one first swapping circuit node and electrically couples a second subset of the plurality of duplicate electronic circuits to the at least one second swapping circuit node for each of the successive switching states.

5. The integrated circuit of claim 4, wherein the first subset and the second subset comprise different numbers of the plurality of duplicate electronic circuits.

6. The integrated circuit of claim 4, wherein the switch circuit performs chopping in which a first one of the plurality of duplicate electronic circuits is coupled to the at least one first swapping circuit node in a first switching state and to the at least one second swapping circuit node in a second, sequential switching state, and wherein a second one of the plurality of duplicate electronic circuits is coupled to the at least one second swapping circuit node in the first switching state and to the at least one first swapping circuit node in the second switching state.

7. The integrated circuit of claim 1, wherein:
   the functional circuit includes a plurality of first swapping circuit nodes and a plurality of second swapping circuit nodes; and
   wherein the switch circuit electrically couples a plurality of terminals of each of a first subset of the plurality of duplicate electronic circuits to the plurality of first swapping circuit nodes and electrically couples a plurality of terminals of each of a second subset of the plurality of duplicate electronic circuits to the plurality of second swapping circuit nodes for each of the successive switching states.

8. The integrated circuit of claim 1, wherein at least one of the plurality of duplicate electronic circuits is selected in at least two successive switching states.

9. The integrated circuit of claim 1, wherein the switch circuit pseudo-randomly selects from among the plurality of duplicate electronic circuits for each selected subset in each switching state.

10. The integrated circuit of claim 1, wherein a duration of each of the successive switching states is pseudo-randomly selected.

11. The integrated circuit of claim 1, wherein at least one terminal of each unselected ones of the plurality of duplicate electronic circuits is coupled to a bias node.

12. A method of reducing noise on a semiconductor circuit, comprising:
   selecting a subset from among a plurality of duplicate electronic circuits that are susceptible to random telegraph noise (RTN) and that are integrated on the semiconductor circuit in close proximity with each other;
   electrically coupling the selected duplicate electronic devices to at least one swapping circuit node of a functional circuit; and
   repeating the selecting and electrically coupling in successive switching states during operation of the functional circuit for different subsets of the plurality of duplicate electronic circuits.

13. The method of claim 12, wherein the electrically coupling comprises electrically coupling a subset of terminals of the selected duplicate electronic devices that are not already coupled to the function circuit.

14. The method of claim 12, wherein the electrically coupling comprises electrically coupling a first subset of the plurality of duplicate electronic circuits to at least one first swapping circuit node of the functional circuit and electrically coupling a second subset of the plurality of duplicate electronic circuits to at least one second swapping circuit node of the functional circuit.

15. The method of claim 12, wherein the electrically coupling comprises electrically coupling a first number of the plurality of duplicate electronic circuits to at least one first swapping circuit node of the functional circuit and electrically coupling a second and different number of the plurality of duplicate electronic circuits to at least one second swapping circuit node of the functional circuit.

16. The method of claim 12, wherein the electrically coupling comprises chopping by electrically coupling a first duplicate electronic circuit to the at least one first swapping circuit node in a first switching state and to at least one second swapping circuit node in a second, sequential switching state, and by coupling a second duplicate electronic circuit to the at least one second swapping circuit node in the first switching state and to the at least one first swapping circuit node in the second switching state.

17. The method of claim 12, wherein the electrically coupling comprises electrically coupling a plurality of terminals of each of a first subset of the plurality of duplicate electronic circuits to a plurality of first swapping circuit nodes and electrically coupling a plurality of terminals of each of a second subset of the plurality of duplicate electronic circuits to a plurality of second swapping circuit nodes.

18. The method of claim 12, wherein the selecting a subset comprises pseudo-randomly selecting from among the plurality of duplicate electronic circuits for each switching state.

19. The method of claim 12, further comprising pseudo-randomly selecting a duration of each of the successive switching states.

20. The method of claim 12, further comprising electrically coupling at least one terminal of each of unselected ones of the plurality of duplicate electronic circuits to a bias node.

* * * * *